United States Patent
Ichiryu et al.

(10) Patent No.: US 8,841,774 B2
(45) Date of Patent: Sep. 23, 2014

(54) SEMICONDUCTOR DEVICE INCLUDING A FIRST WIRING HAVING A BENDING PORTION A VIA

(71) Applicant: Panasonic Corporation, Osaka (JP)

(72) Inventors: Miwa Ichiryu, Osaka (JP); Hiroyuki Uehara, Hyogo (JP); Hidetoshi Nishimura, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/789,107

(22) Filed: Mar. 7, 2013

(65) Prior Publication Data

US 2013/0181358 A1 Jul. 18, 2013

Related U.S. Application Data

(62) Division of application No. 12/920,442, filed as application No. PCT/JP2010/000171 on Jan. 14, 2010, now Pat. No. 8,426,978.

(30) Foreign Application Priority Data

Feb. 17, 2009 (JP) ................................. 2009-033359

(51) Int. Cl.
| | |
|---|---|
| *H01L 23/48* | (2006.01) |
| *H01L 23/522* | (2006.01) |
| *H01L 27/118* | (2006.01) |
| *H01L 23/528* | (2006.01) |
| *H01L 27/02* | (2006.01) |

(52) U.S. Cl.
CPC .......... *H01L 23/481* (2013.01); *H01L 23/5226* (2013.01); *H01L 27/11807* (2013.01); *H01L 23/528* (2013.01); *H01L 27/0207* (2013.01)
USPC ............ 257/774; 257/E23.011; 257/E27.108; 257/E23.145; 257/E23.151; 257/758; 257/690; 257/691; 257/692; 257/693; 257/698; 257/202; 257/207; 257/208; 257/211

(58) Field of Classification Search
USPC .......... 257/774, E23.011, 758, 690, 691, 692, 257/693, 696, 698, 202, 207, 208, 211, 257/E27.108, E23.145, E23.151
See application file for complete search history.

(56) References Cited

U.S. PATENT DOCUMENTS

| | | |
|---|---|---|
| 5,978,301 A | 11/1999 | Maeno et al. |
| 6,271,548 B1 | 8/2001 | Umemoto et al. |

(Continued)

FOREIGN PATENT DOCUMENTS

| | | |
|---|---|---|
| CN | 1630062 A | 6/2005 |
| JP | 2000-148821 A | 5/2000 |

(Continued)

OTHER PUBLICATIONS

Notice of Allowance mailed Dec. 10, 2012 issued in corresponding U.S. Appl. No. 12/920,442.

*Primary Examiner* — Alexander Oscar Williams
(74) *Attorney, Agent, or Firm* — McDermott Will & Emery LLP

(57) ABSTRACT

A first wiring (1) has a bending portion (2), a first wiring region (1a) extending from the bending portion (2) in the X direction, and a second wiring region (1b) extending from the bending portion (2) in the Y direction. A via (3) is formed under the wiring (1). The via (3) is formed so as not to overlap with a region of the bending portion (2) in the first wiring region (1a). The length of the via (3) in the X direction (x) is longer than the length thereof in the Y direction (y) and both ends of the via (3) in the Y direction overlap with both ends of the first wiring region (1a) in the Y direction.

19 Claims, 26 Drawing Sheets

(56) References Cited

U.S. PATENT DOCUMENTS

| | | |
|---|---|---|
| 6,779,167 B2 | 8/2004 | Igarashi et al. |
| 8,030,773 B2 | 10/2011 | Kurata et al. |
| 2002/0162079 A1 | 10/2002 | Igarashi et al. |
| 2004/0065907 A1 | 4/2004 | Maeno et al. |
| 2004/0210862 A1 | 10/2004 | Igarashi et al. |
| 2005/0136650 A1 | 6/2005 | Tsuchida |
| 2006/0136848 A1 | 6/2006 | Ichiryu et al. |
| 2007/0273028 A1 | 11/2007 | Kurata et al. |
| 2009/0039520 A1 | 2/2009 | Tanaka et al. |

FOREIGN PATENT DOCUMENTS

| | | | |
|---|---|---|---|
| JP | 2000-148821 A | * | 5/2000 |
| JP | 2000148821 A | | 5/2000 |
| JP | 2002-329783 A | | 11/2002 |
| JP | 2006-294771 A | | 10/2006 |
| JP | 2007-043049 A | | 2/2007 |
| JP | 2007-317924 A | | 12/2007 |
| JP | 2007-317924 A | * | 12/2007 |
| JP | 2010-003712 A | | 1/2010 |

* cited by examiner (a)

(b)

(c)

(d)

(a)

(b)

(c)

(a)

(b)

(c)

(d)

(e)

(f)

(g)

(a)

(b)

(c)

(d)

(a)

(b)

(c)

(d)

(a)

(b)

(c)

(d)

(a)

(b)

(a)

(b)

(c)

(a)

(b)

(a)

(b)

(a)

(b)

(a)

(b)

(c)

SEMICONDUCTOR DEVICE INCLUDING A FIRST WIRING HAVING A BENDING PORTION A VIA

RELATED APPLICATIONS

This application is a Divisional of U.S. patent application Ser. No. 12/920,442, filed on Aug. 31, 2010, now U.S. Pat. No. 8,426,978, which is the U.S. National Phase under 35 U.S.C. §371 of International Application No. PCT/JP2010/000171, filed on Jan. 14, 2010, which in turn claims the benefit of Japanese Application No. 2009-033359, filed on Feb. 17, 2009, the disclosures of which Applications are incorporated by reference herein.

TECHNICAL FIELD

The present disclosure relates to a configuration of a semiconductor device responding to a micro fabrication process, particularly, to a configuration of a wiring and a connecting hole (via) under the wiring.

BACKGROUND ART

Conventionally, a dual-damascene method has been known as a technique in which after a wiring groove is formed on an insulation film and a via is formed on the bottom of the wiring groove, a conductive material is filled into the wiring groove and the via so as to form a wiring and a contact portion at the same time. In the dual-damascene method, a so-called first-trench system is known (see, Patent Document 1, for example). In the first-trench system, a via pattern is formed on a hard mask by a lithography technique, then a via and a wiring groove are formed by etching. At this time, a wiring pattern has been previously formed on the hard mask.

Configurations of a wiring and a via in the dual-damascene method with the conventional first-trench system are described with reference to FIG. 25. FIG. 25(a) is a plan view illustrating arrangement positions and shapes of a wiring and a via under the wiring. FIG. 25(b) is a plan view illustrating a shape of the wiring only. FIG. 25(c) is a plan view illustrating a shape of a via pattern used when a via mask is formed at manufacturing a semiconductor device. FIG. 25(d) is a plan view illustrating a shape of the via only. FIG. 25(e) is a cross sectional view illustrating a cross section cut along a line A1-A1' of the plan view in FIG. 25(a). FIG. 25(f) is a cross sectional view illustrating a cross section cut along a line A2-A2' of the plan view in FIG. 25(a).

As shown in FIGS. 25(a) to 25(d), if a semiconductor substrate is viewed planarly in the direction vertical to the substrate from the top, a substantial overlapped portion of a via pattern 4 and a wiring 1 corresponds to a planar shape of a via 31 to be formed. In FIG. 25(a), since the via 31 is located under the wiring 1, the via 31 is shown by a dotted line.

A shape of a cross section of the via 31 is simply described with reference to FIGS. 25(e) and 25(f). In the dual-damascene method, a wiring formation hard mask 203 is formed on an insulation film 201 located above a lower layer wiring 200, then, a via formation resist mask 204 is formed on the wiring formation hard mask 203. At this time, a wiring pattern 202 has been formed on the wiring formation hard mask 203 and a via pattern 4 has been formed on the via formation resist mask 204. Thereafter, the insulation film 201 is etched by using the via formation resist mask 204 to form a via portion 206 so as to be extended in the depth direction. Further, after the via formation resist mask 204 is removed, the insulation film 201 is etched by using the wiring formation hard mask 203 so as to form a wiring portion 205 so as to be extended in the depth direction. The wiring 1 and the via 31 are simultaneously formed by filling the wiring portion 205 and the via portion 206 with a metal at once.

In a semiconductor manufacturing process, a minimum dimension of the width of a wiring pattern and that of a via pattern are defined conventionally. In a micro fabrication process in recent years, a resolution of the wiring pattern is higher than that of the via pattern so that the minimum dimension of the wiring pattern 202 is smaller than that of the via pattern 4 due to a technical constraint of a manufacturing apparatus. Therefore, a finished planar shape of the via 31 formed under the wiring having the width of minimum dimension corresponds to a substantial overlapped portion of the via pattern 4 having a circular shape and the wiring 1 having the width narrower than a diameter of the via pattern 4 by forming the via with self alignment in the dual-damascene method.

In the layout design of LSI using a placement and routing tool with on-grid design scheme, a plurality of terminals which are capable of transmitting an input signal and an output signal of a basic cell are located at the intersections of wiring grids lined in the X direction and those lined in the Y direction (see Patent Document 2, for example). In order to ensure a wiring resource in an arrangement wiring, via has had a tendency to be arranged near the intersections of wiring grids lined in the X direction and those lined in the Y direction. It is to be noted that the X direction denotes a direction along a power-source wiring of a basic cell while the Y direction denotes a direction vertical to the power-source wiring.

CITATION LIST

Patent Document

PATENT DOCUMENT 1: Japanese Patent Publication No. 2006-294771

PATENT DOCUMENT 2: Japanese Patent Publication No. 2007-43049

SUMMARY OF THE INVENTION

Technical Problem

In the conventional semiconductor device, when a via is formed under a wiring having a bending portion, via is formed under the bending portion in many cases. For example, in FIG. 25(a), a via 31 is formed on the lower portion of a bending portion 2 of an L-shaped wiring 1. However, in this case, a shape of the formed via 31 unfortunately has a notch (substantially recess portion) 5 where a part of a circumferential portion of the via 31 is partly notched by a self alignment, as shown in FIG. 25(d). The via having such a notch makes metal filling rate low in a process of filling the via portion with a metal due to the deformation of the shape in some case. This causes insufficient filling of the metal into the via and eventually causes deterioration in manufacturing yield of the semiconductor device.

Further, in a case where a via is formed under a bending portion 21 of a T-shaped wiring 11 as shown in FIG. 26(a), or a case where a via is formed under a bending portion 22 of a cross-shaped wiring 12 as shown in FIG. 26(b), the same problem is also caused. That is to say, each of a via 32 and a via 33 has notches 5 because each via has the same shape as each of the overlapped portions of a via pattern 4 as shown in FIG. 26(c) and wirings 11, 12. Therefore, as in the case in FIG. 25, there is a possibility that the metal filling rate is made low in a process of filling the via portion with a metal.

The present invention is made in order to solve the above conventional problem and an object of the invention is to provide a technique of suppressing the decrease in metal filling rate which is caused by the deformed via shape in a semiconductor device having a wiring and a via under the wiring.

Solution to the Problem

A semiconductor device according to a first aspect of the invention includes a first wiring, a second wiring which is arranged on a lower layer of the first wiring, and a first via which is formed between the first wiring and the second wiring and electrically connects the first wiring and the second wiring, wherein in a planar view, the first wiring comprises a bending portion, a first wiring region extending from the bending portion in a first direction, and a second wiring region extending from the bending portion in a second direction orthogonal to the first direction, and in a planar view, the first via is formed in the first wiring region so as not to overlap with a region of the bending portion, a length of the first via in the first direction is longer than a length of the first via in the second direction, and both ends of the first via in the second direction are overlapped with both ends of the first wiring region in the second direction.

According to the aspect, a deformed-shaped via having a notch is not formed since the first via is formed so as not to overlap with a region of the bending portion of the first wiring. Therefore, the decrease in metal filling rate which is caused by the deformed via shape having a notch can be suppressed.

A semiconductor device according to a second aspect of the invention includes a first wiring, a second wiring which is arranged on a lower layer of the first wiring, and a first via which is formed between the first wiring and the second wiring and electrically connects the first wiring and the second wiring, wherein in a planar view, the first wiring comprises a bending portion, a first wiring region extending from the bending portion in a first direction, a second wiring region extending from the bending portion in a second direction orthogonal to the first direction, and a first projection which is formed so as to project from the bending portion in a direction between the first wiring region and the second wiring region, and in a planar view, the first via is arranged so as to include a region of the bending portion, and in a planar view, an end of the first via in the direction between the first wiring region and the second wiring region is closer to the bending portion than an end of the first projection.

According to the aspect, a region of the bending portion of the first wiring is expanded by the first projection and the end of the first via is located at the inner side of the first projection. Therefore, a via having no notch can be formed under the bending portion. This makes it possible to suppress the decrease in metal filling rate which is caused by the deformed via shape having a notch.

A semiconductor device according to a third aspect of the invention includes a first wiring, a second wiring which is arranged on a lower layer of the first wiring, and a first via which is formed between the first wiring and the second wiring and electrically connects the first wiring and the second wiring, wherein in a planar view, the first wiring comprises a bending portion, a first wiring region extending from the bending portion in a first direction, and a second wiring region extending from the bending portion in a second direction orthogonal to the first direction, in a planar view, the first via is arranged so as to include a region of the bending portion, and in a planar view, a length of the first via projecting from the bending portion in the first direction in the first wiring region is longer than a length of the first via projecting from the bending portion in the second direction in the second wiring region.

According to the aspect, the first via is arranged so as to include a region of the bending portion and the length of the first via projecting from the bending portion in the first direction in the first wiring region is longer than the length of the first via projecting from the bending portion in the second direction in the second wiring region. Therefore, a via which is enough large to reduce the affect by the decrease in metal filling rate is formed under the bending portion. This makes it possible to suppress the decrease in metal filling rate which is caused by the deformed via shape having a notch.

Then, the invention includes a basic cell having the same characteristics as in the above first and second aspects.

Further, the invention includes a semiconductor integrated circuit device including a plurality of basic cells having the same characteristics as in the above first to third aspects.

Advantages of the Invention

According to the invention, the decrease in metal filling rate which is caused by the deformed via shape having a notch can be suppressed. Therefore, deterioration in manufacturing yield caused by insufficient filling into via can be suppressed.

BRIEF DESCRIPTION OF THE DRAWINGS

FIGS. 1(a) and 1(e) are plan views of a wiring and vias. FIG. 1(b) is a plan view of the wiring only. FIGS. 1(c) and 1(f) are plan views of the vias only. FIGS. 1(d) and 1(g) are plan views of via patterns.

FIGS. 2(a) to 2(c) are plan views of a T-shaped wiring and a via. FIG. 2(d) is a plan view of a cross-shaped wiring and a via. FIG. 2(e) is a plan view of a via pattern.

FIG. 3(a) is a plan view of a wiring and vias. FIG. 3(b) is a plan view of the wiring only. FIG. 3(c) is a plan view of the vias only. FIG. 3(d) is a plan view of a via pattern.

FIG. 4(a) is a plan view of a T-shaped wiring and vias. FIG. 4(b) is a plan view of a cross-shaped wiring and vias. FIG. 4(c) is a plan view of a via pattern.

FIGS. 5(a), 5(e) to 5(g) are plan views of a wiring and a via. FIG. 5(b) is a plan view of the wiring only. FIG. 5(c) is a plan view of the via only. FIG. 5(d) is a plan view of a via pattern.

FIG. 6(a) is a plan view of a T-shaped wiring and a via. FIG. 6(b) is a plan view of a cross-shaped wiring and a via. FIG. 6(c) is a plan view of the vias only. FIG. 6(d) is a plan view of a via pattern.

FIG. 7(a) is a plan view of the wiring and a via. FIG. 7(b) is a plan view of the wiring only. FIG. 7(c) is a plan view of the via only. FIG. 7(d) is a plan view of a via pattern.

FIGS. 8(a) and 8(b) are plan views of a T-shaped wiring and vias. FIG. 8(c) is a plan view of a cross-shaped wiring and a via. FIG. 8(d) is a plan view of the vias only. FIG. 8(e) is a plan view of a via pattern.

FIG. 9(a) is a plan view of a wiring and a via. FIG. 9(b) is a plan view of the wiring only. FIG. 9(c) is a plan view of the via only. FIG. 9(d) is a plan view of a via pattern.

FIGS. 10(a) and 10(b) are plan views of a T-shaped wiring and vias. FIG. 10(c) is a plan view of a cross-shaped wiring and a via. FIG. 10(d) is a plan view of the vias only. FIG. 10(e) is a plan view of a via pattern.

FIG. 11(a) is a plan view of a wiring and a via. FIG. 11(b) is a plan view of the wiring only. FIG. 11(c) is a plan view of the via only. FIG. 11(d) is a plan view of a via pattern.

FIG. 12(a) is a circuit diagram. FIG. 12(b) is a plan view.

FIG. 15(a) is a plan view. FIG. 15(b) is a cross sectional view.

FIG. 16(a) is a plan view. FIG. 16(b) is a cross sectional view.

FIG. 19(a) is a plan view. FIG. 19(b) is a cross sectional view.

FIG. 22(a) is a plan view. FIG. 22(b) is a cross sectional view.

FIG. 25(a) is a plan view of a wiring and a via. FIG. 25(b) is a plan view of the wiring only. FIG. 25(c) is a plan view of a via pattern. FIG. 25(d) is a plan view of the via only. FIGS. 25(e) and 25(f) are cross sectional views of the wiring and the via.

FIGS. 26(a) and 26(b) are plan views of wirings and a via. FIG. 26(c) is a plan view of a via pattern.

DESCRIPTION OF EMBODIMENTS

Hereinafter, embodiments of the invention will be described with reference to drawings.

First Embodiment

Figure 1:
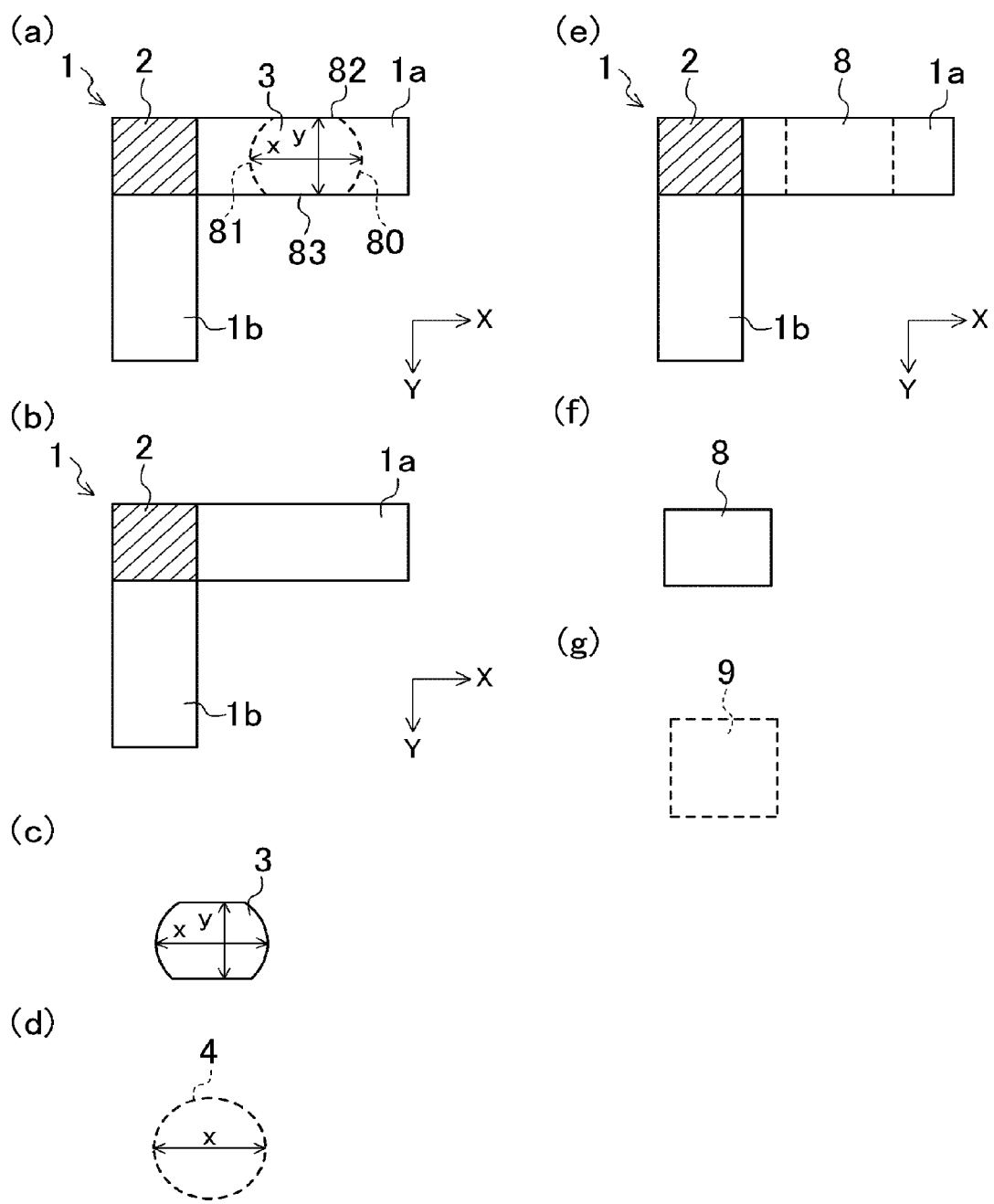
FIG. 1 are views illustrating configurations of a wiring and vias under the wiring according to the first embodiment.

FIG. 1 are views illustrating configurations of a wiring and vias under the wiring according to the first embodiment. FIG. 1(a) is a plan view illustrating arrangement positions and shapes of a wiring 1 and a via 3 under the wiring 1. FIG. 1(b) is a plan view illustrating a shape of the wiring 1 only. FIG. 1(c) is a plan view illustrating a shape of the via 3 only. FIG. 1(d) is a plan view of a via pattern 4 used when a mask for the via 3 is formed at manufacturing a semiconductor device. FIG. 1(e) is a plan view illustrating arrangement positions and shapes of the wiring 1 and a via 8 under the wiring 1. FIG. 1(f) is a plan view illustrating a shape of the via 8 only. FIG. 1(g) is a plan view of a via pattern 9 used when a mask for the via 8 is formed at manufacturing a semiconductor device.

A number of bending portions 2 which are bending regions are generally provided on a wiring path in a wiring of a semiconductor device. For example, the L-shaped wiring 1 as a first wiring has the bending portion 2, as shown in FIG. 1(b). In the present specification, note that the "bending portion" of the wiring indicates a portion corresponding to both base ends of a wiring region extending in the X direction (first direction) and a wiring region extending in the Y direction (second direction orthogonal to the first direction). That is to say, wiring regions are extended from the bending portion 2 in both the X direction and the Y direction. The wiring 1 has the bending portion 2, a first wiring region 1a extending from the bending portion 2 in the X direction and a second wiring region 1b extending from the bending portion 2 in the Y direction.

A via is formed between the wiring 1 and a second wiring (not shown) arranged on a lower layer of the wiring 1. The via electrically connects the wiring 1 and the second wiring. The second wiring passes through a portion under the bending portion 2. Conventionally, the via under the wiring is generally arranged under the bending portion 2 in an arrangement wiring design. Further, in the semiconductor device using the dual-damascene method, the via under the wiring is formed so as to connect to the wiring by self alignment.

However, in the embodiment, the via 3 as a first via under the wiring 1 is arranged so as not to overlap with a region of the bending portion 2 in a planar view, as shown in FIG. 1(a). In other words, an overlapped portion of the wiring 1 and the via pattern 4 is located outside the region of the bending portion 2. In the specification, note that the "planar view" indicates that the semiconductor substrate on which the wiring and the via under the wiring are formed is viewed from the top in the direction vertical to a substrate surface. Further, the via 3 is shown by a dotted line because the via 3 is located under the wiring 1. This is true in the subsequent drawings.

A shape of the via 3 is determined by an overlapped portion of the wiring 1 and the via pattern 4 by self alignment. Here, the diameter (dimension x) of the via pattern 4 is longer than the width (dimension y) of the wiring 1. Therefore, in a planar view, the length of the via 3 in the X direction (dimension x) is longer than the length thereof in the Y direction (dimension y) so that both ends 82, 83 thereof in the Y direction are overlapped with both ends of the wiring region 1a in the Y direction.

Further, the both ends 80, 81 of the via 3 in the X direction have circular arc shapes expanding outward in accordance with the via pattern 4.

Figure 25:
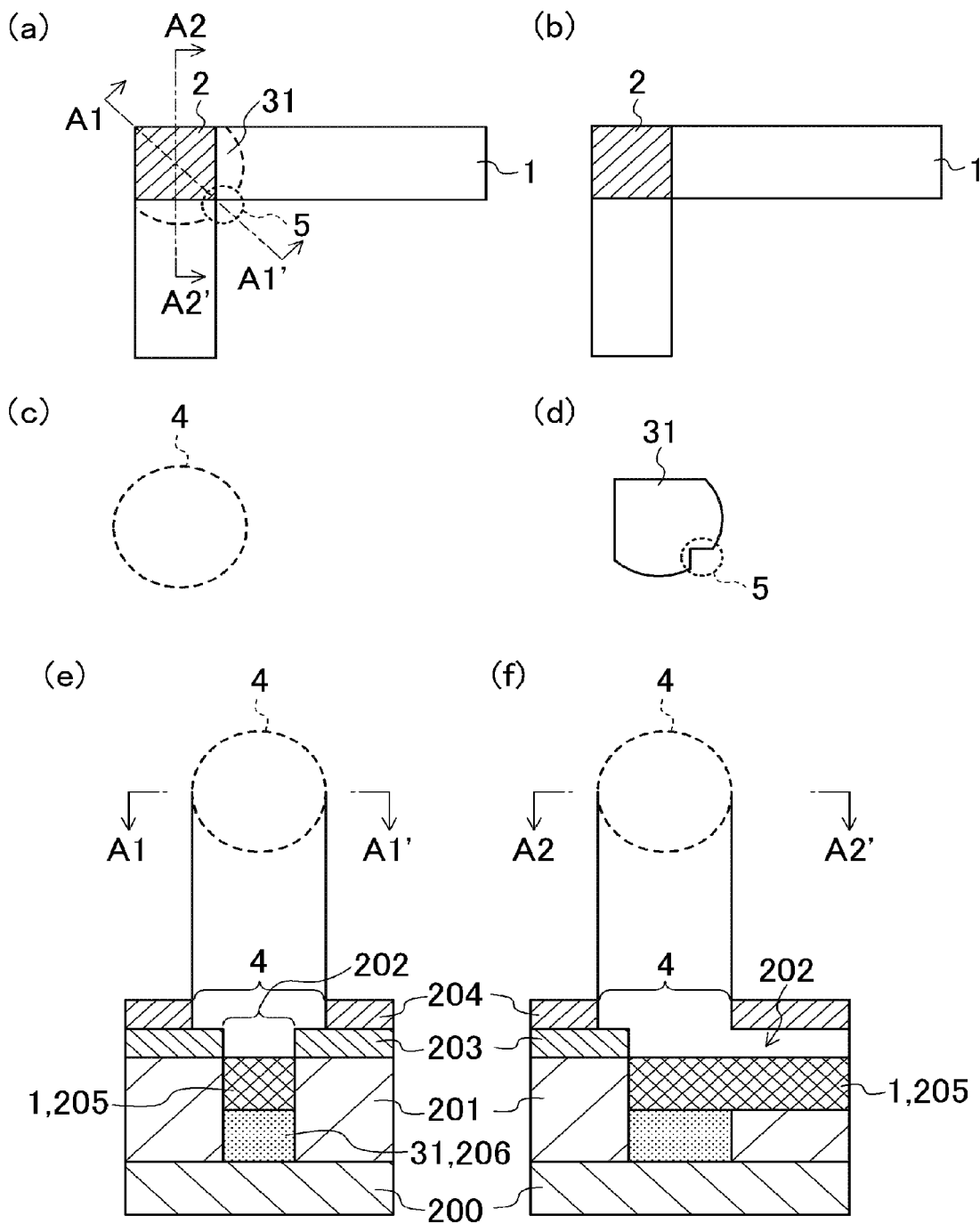
FIG. 25 are views illustrating conventional configurations of a wiring and a via under the wiring.
Figure 26:
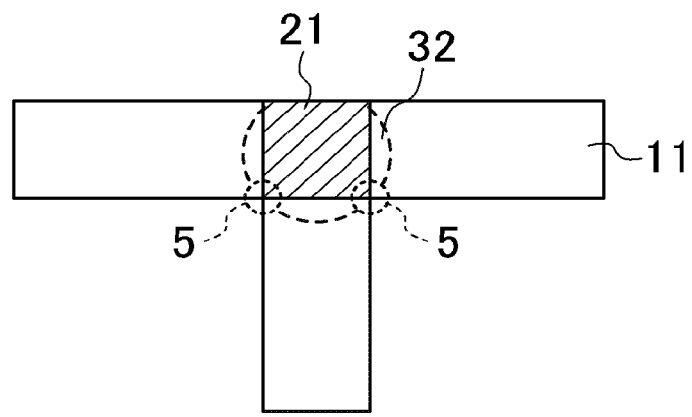
FIG. 26 are views illustrating conventional configurations of wirings and a via under the wiring.
Figure 26:
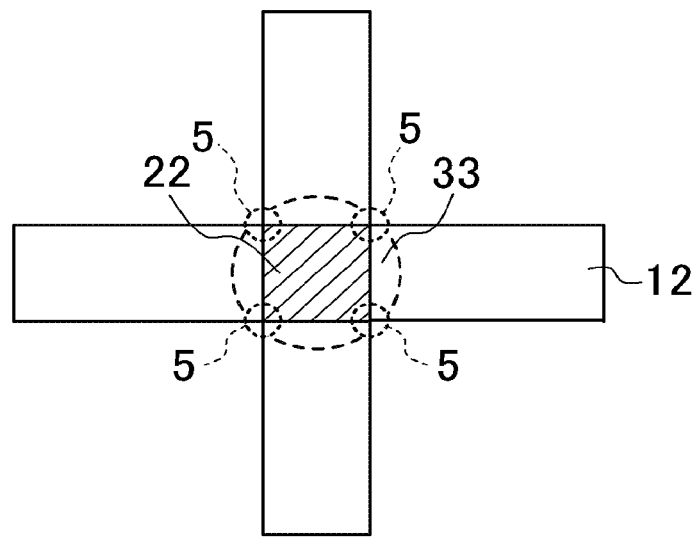
Figure 26:
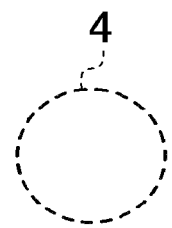

According to the embodiment, since the via 3 is arranged and formed outside the region of the bending portion 2 in the wiring 1, the via 3 has a shape having no notch 5 which is formed on the conventional via 31 in FIG. 25(d). Therefore, the decrease in metal filling rate which is caused by the deformed via shape having a notch can be suppressed.

Although a case where the via pattern 4 has a circular shape is described in FIGS. 1(a) to 1(d), the via pattern is not limited to the circular shape and the via pattern may have any shapes as long as a diameter of the via pattern is longer than the wiring width of the wiring 1. For example, a rectangular via pattern 9 as shown in FIG. 1(g) is arranged outside the region of the bending portion 2 in the wiring 1 so that the via 8 as shown in FIGS. 1(e) and 1(f) may be formed. Further, the same effect can be obtained with other via pattern shapes.

Modification of First Embodiment

Although the L-shaped wiring 1 is shown in FIG. 1 as an example, the same effect can be also obtained by arranging and forming a via in the same manner when a T-shaped wiring 11 as shown in FIGS. 2(a) to 2(c) or a cross-shaped wiring 12 as shown in FIG. 2(d) is employed. That is to say, the via 3 is formed by arranging a via pattern 4 as shown in FIG. 2(e) on the outside of a bending portion 21 in the wiring 11 in FIGS. 2(a) to 2(c). Further, the via 3 is formed by arranging the via pattern 4 as shown in FIG. 2(e) on the outside of a bending portion 22 in the wiring 12 in FIG. 2(d).

Second Embodiment

Figure 3:
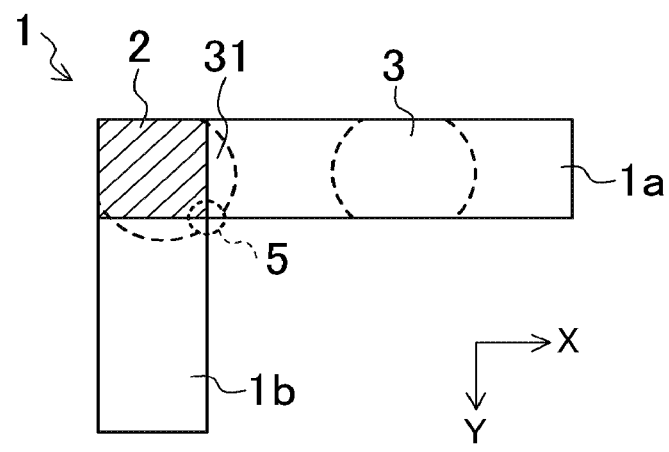
FIG. 3 are plan views illustrating configurations of a wiring and vias under the wiring according to a second embodiment.
Figure 3:
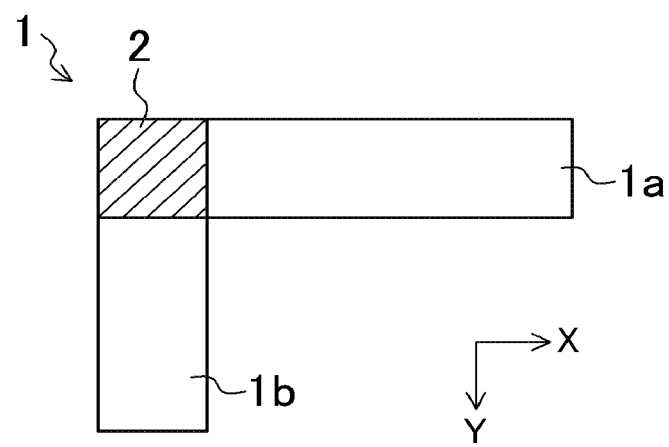
Figure 3:
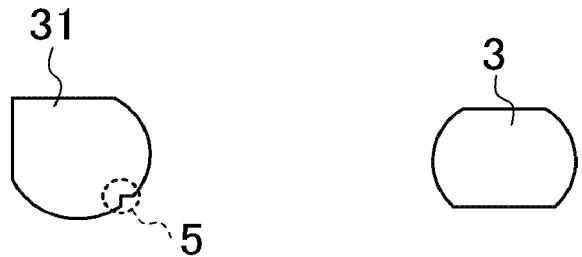
Figure 3:
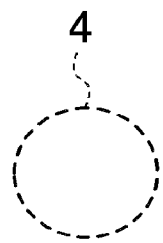

FIG. 3 are views illustrating configurations of a wiring and vias under the wiring according to the second embodiment. FIG. 3(a) is a plan view illustrating arrangement positions and shapes of a wiring 1 and vias 3, 31 under the wiring 1. FIG. 3(b) is a plan view illustrating a shape of the wiring 1 only. FIG. 3(c) is a plan view illustrating shapes of the vias 3, 31 only. FIG. 3(d) is a plan view of a via pattern used when masks for the vias 3, 31 are formed at manufacturing a semiconductor device. The configuration in FIG. 3 is substantially the same as that in FIG. 1 and the same reference numerals as that in FIG. 1 denote the same components as those in FIG. 1.

In the configuration in FIG. 3, in addition to the via 3, the via 31 as a second via is also formed between the wiring 1 and a second wiring (not shown) arranged on a lower layer of the wiring 1. The via 31 is formed so as to include the region of the bending portion 2. The via 31 has a notch 5 as the conventional via has. In the first embodiment as described above, the via 3 is arranged and formed only on a position outside the region of the bending portion 2 in the wiring 1. However, the via 31 may be arranged and formed under the bending portion 2 while the via 3 is arranged and formed so as not to overlap with the region of the bending portion 2, as shown in FIG. 3. That is, the configuration in FIG. 3 is equivalent to a configuration obtaining by arranging and forming a redundant via 3 in addition to the conventional via configuration so that the same effect as in the above first embodiment can be obtained.

Modification of Second Embodiment

Figure 4:
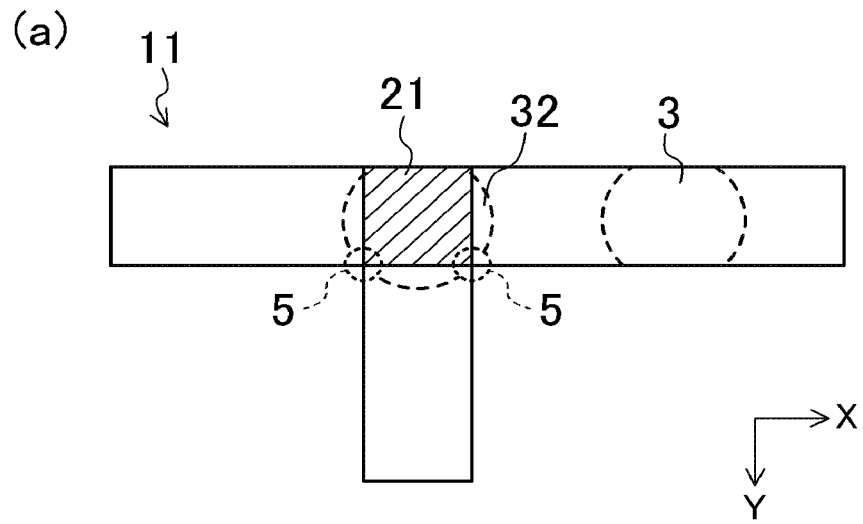
FIG. 4 are plan views illustrating configurations of wirings and vias under the wirings according to a modification of the second embodiment.
Figure 4:
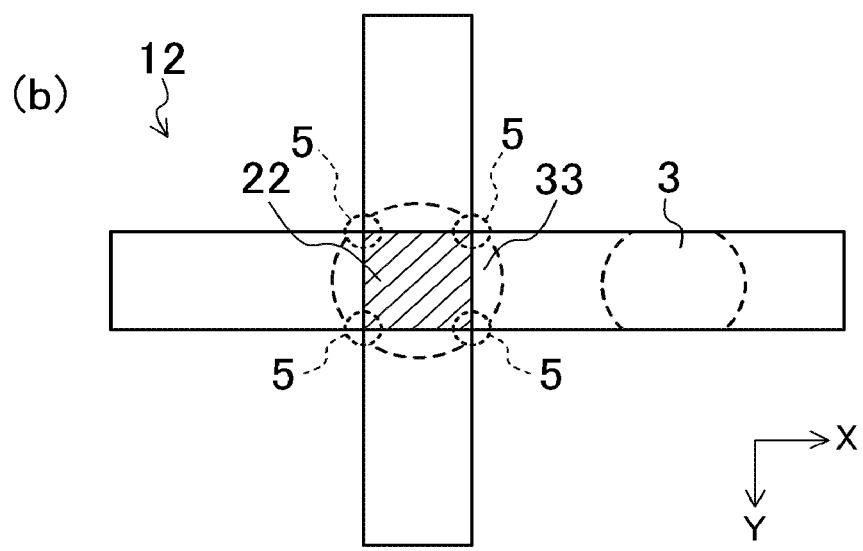
Figure 4:

Although the L-shaped wiring 1 is described as an example in the above second embodiment, the same effect can be also obtained by arranging and forming a via in the same manner when a T-shaped wiring 11 as shown in FIG. 4(a) or a cross-shaped wiring 12 as shown in FIG. 4(b) is employed. That is to say, vias 3, 32 are formed by arranging the via pattern 4 as shown in FIG. 4(c) on the outside and inside of the region of the bending portion 21 in the wiring 11 in FIG. 4(a). Further, vias 3, 33 are formed by arranging the via pattern 4 as shown in FIG. 4(c) on the outside and inside of the region of bending portion 22 of the wiring 12 in FIG. 4(b). The vias 32, 33 have notches 5 as the conventional via has.

Third Embodiment

Figure 5:
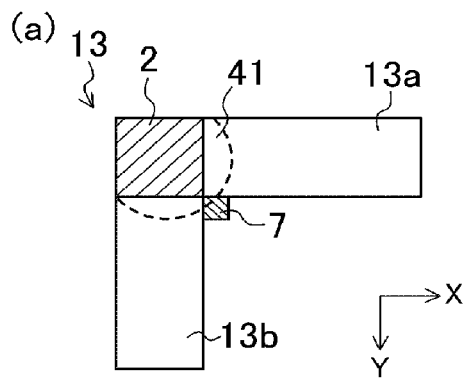
FIG. 5 are plan views illustrating configurations of a wiring and a via under the wiring according to a third embodiment.
Figure 5:
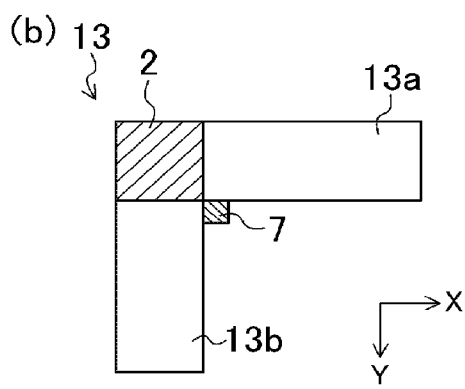
Figure 5:
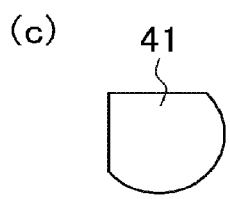
Figure 5:
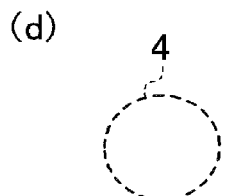
Figure 5:
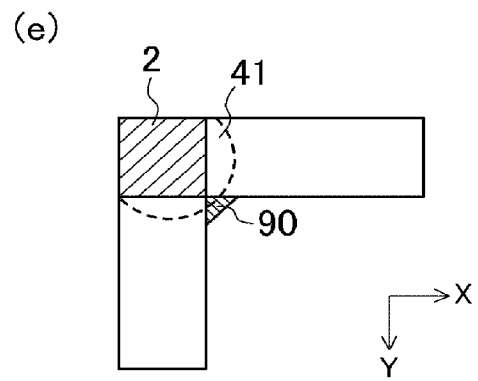
Figure 5:
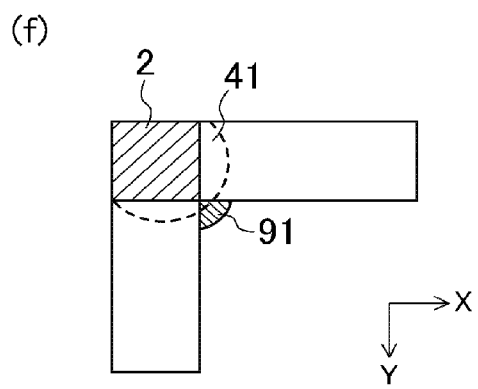
Figure 5:
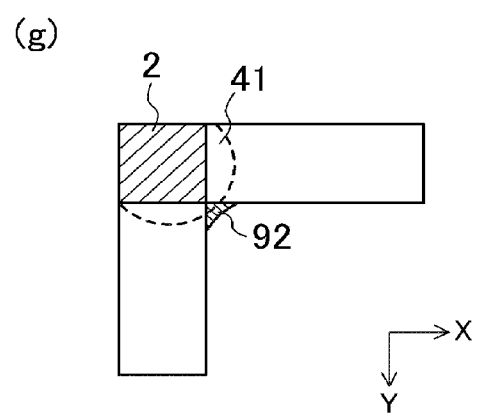

FIG. 5 are plan views illustrating configurations of a wiring and a via under the wiring according to the third embodiment. FIG. 5(a) is a plan view illustrating arrangement positions and shapes of a wiring 13 and a via 41 under the wiring 13. FIG. 5(b) is a plan view illustrating a shape of the wiring 13 only. FIG. 5(c) is a plan view illustrating a shape of the via 41 only. FIG. 5(d) is a plan view of a via pattern 4 used when a mask for the via 41 is formed at manufacturing a semiconductor device. FIGS. 5(e) to 5(g) are plan views illustrating examples of other shapes of the wiring.

The configuration in FIG. 5, the via 41 as a first via is formed between the wiring 13 as a first wiring and a second wiring (not shown) arranged on a lower layer of the wiring 13. The via 41 is formed by using the via pattern 4 having a circular shape larger than the bending portion 2, as shown in FIG. 5(d).

The wiring 13 has the bending portion 2, a first wiring region 13a extending from the bending portion 2 in the X direction and a second wiring region 13b extending from the bending portion 2 in the Y direction, as shown in FIG. 5(b). The wiring 13 also has a rectangular projection 7 as a first projection which is formed so as to project from the bending portion 2 in the direction between the first and second wiring region 13a, 13b. The projection 7 expands an end of the wiring 13 in the direction of the narrow angle side with which the wiring 13 is bended.

As shown FIG. 5(a), the via 41 is arranged so as to substantially include the region of the bending portion 2. The shape of the via 41 is determined by an overlapped portion of the wiring 13 and the via pattern 4 by self alignment as in the first embodiment. Therefore, a portion of the via pattern 4 located within the region of the wiring 13 corresponds to the via 41. That is, the end of the via 41 is substantially the same as that of the via pattern 4 in the first and second wiring regions 13a, 13b. The ends of the via 41 substantially overlap with those of the wiring 13 at the upper side and the left side of the bending portion 2.

The wiring 13 around the bending portion 2 including the projection 7 is formed so as to be sufficiently larger than the size of the via pattern 4. Therefore, the end of the via 41 in the direction between the first and second wiring regions 13a, 13b is located within the projection 7, that is, closer to the bending portion 2 than the end of the projection 7. Accordingly, the via 41 has no notch as shown in FIG. 5(c).

According to the embodiment, the via 41 having no notch can be arranged and formed under the bending portion 2 of the wiring 13. This makes it possible to suppress the decrease in metal filling rate which is caused by the deformed via shape having a notch. Further, since the via 41 can be arranged and formed under the bending portion 2 as in the conventional way, the degree of freedom in the arrangement wiring design is higher than that in the above first and second embodiments in which the via is located outside the region of the bending portion.

It is to be noted that although the rectangular projection 7 is described as an example in the embodiment, the shape of the projection is not limited thereto. For example, a substantially triangle projection 90 as shown in FIG. 5(e), a circular arc projection 91 of which end is expanded outward as shown in FIG. 5(*f*) or a circular arc projection 92 of which end is expanded inward as shown in FIG. 5(*g*) may be provided. The same effect can be obtained by these shapes.

Further, although a circular via pattern 4 is described as an example in the embodiment, the shape of the via pattern is not limited thereto. The same effect can be obtained with the via pattern substantially including a bending portion in the wiring having the projection such as the via pattern having elliptical shape, oval shape, rectangular shape or polygonal shape having no inner angle of more than 180 degree (all shapes are not shown), for example.

Modification of Third Embodiment

Figure 6:
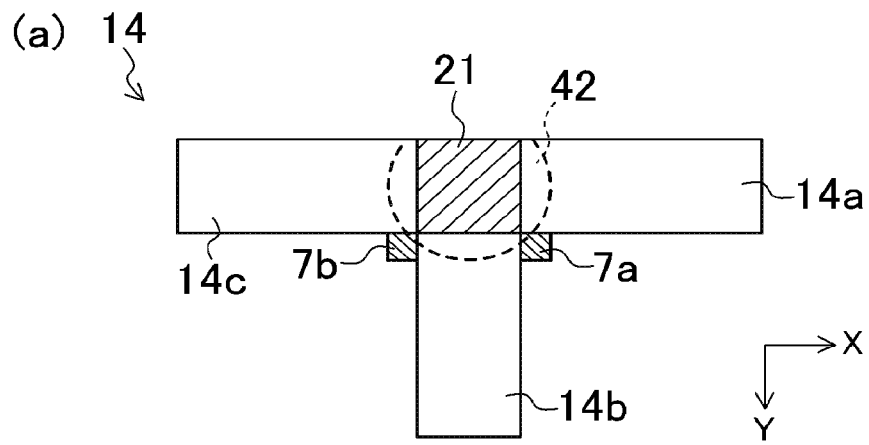
FIG. 6 are plan views illustrating configurations of wirings and vias under the wirings according to a modification of the third embodiment.
Figure 6:
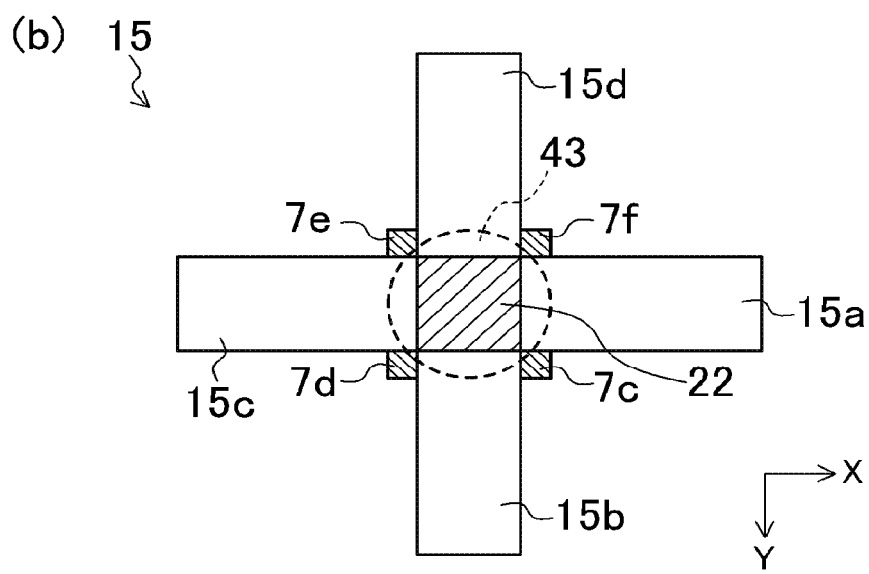
Figure 6:
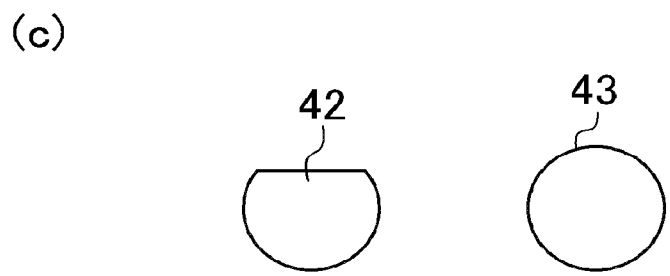
Figure 6:

Although the L-shaped wiring 13 is described as an example in FIG. 5, the same effect can be also obtained by providing a projection and arranging and forming a via in the same manner when a T-shaped wiring 14 as shown in FIG. 6(*a*) or a cross-shaped wiring 15 as shown in FIG. 6(*b*) is employed.

The shape of the T-shaped wiring 14 shown in FIG. 6(*a*) is considered the same as a shape obtained by combining the L-shaped wiring and a wiring formed by rotating the L-shaped wiring by 90 degree so as to overlap the bending portions 21 thereof. That is, the first wiring region 14*a* extends from the bending portion 21 to the right side in the X direction, the second wiring region 14*b* extends from the bending portion 21 to the lower side in the Y direction, and the third wiring region 14*c* extends from the bending portion 21 to the left side in the X direction. A first projection 7*a* is formed so as to project from the bending portion 21 in the direction between the first and second wiring regions 14*a*, 14*b*. Further, a second projection 7*b* is formed so as to project from the bending portion 21 in the direction between the second and third wiring regions 14*b*, 14*c*. A via 42 having no notch is formed as shown in FIG. 6(*c*) by arranging the via pattern 4 shown in FIG. 6(*d*) so as to include the region of the bending portion 21 since the first and second projections 7*a*, 7*b* are provided.

The cross-shaped wiring 15 as shown in FIG. 6(*b*) is considered the same as a shape obtained by combining the T-shaped wiring and a wiring formed by rotating the T-shaped wiring by 180 degree so as to overlap the bending portions 22 thereof. That is, the first wiring region 15*a* extends from the bending portion 22 to the right side in the X direction, the second wiring region 15*b* extends from the bending portion 22 to the lower side in the Y direction, the third wiring region 15*c* extends from the bending portion 22 to the left side in the X direction, and the fourth wiring region 15*d* extends from the bending portion 22 to the upper side in the Y direction. A first projection 7*c* is formed so as to project from the bending portion 22 in the direction between the first and second wiring regions 15*a*, 15*b*. A second projection 7*d* is formed so as to project from the bending portion 22 in the direction between the second and third wiring regions 15*b*, 15*c*. A third projection 7*e* is formed so as to project from the bending portion 22 in the direction between the third and fourth wiring regions 15*c*, 15*d*. A fourth projection 7*f* is formed so as to project from the bending portion 22 in the direction between the fourth and first wiring regions 15*d*, 15*a*. A via 43 having no notch is formed as shown in FIG. 6(*c*) by arranging the via pattern 4 shown in FIG. 6(*d*) so as to include the region of the bending portion 2 since the first to fourth projections 7*c* to 7*f* are provided.

Fourth Embodiment

Figure 7:
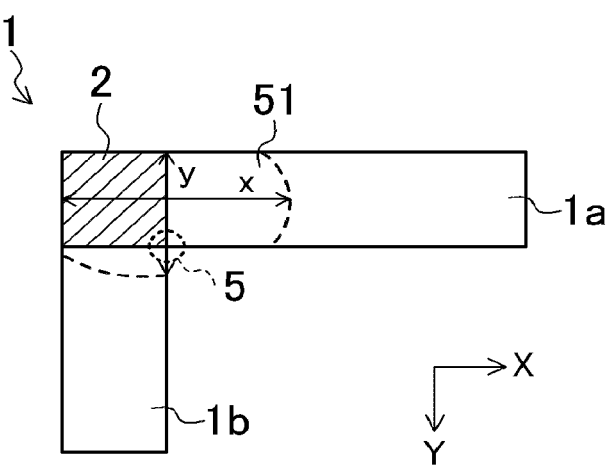
FIG. 7 are plan views illustrating configurations of a wiring and a via under a wiring according to a fourth embodiment.
Figure 7:
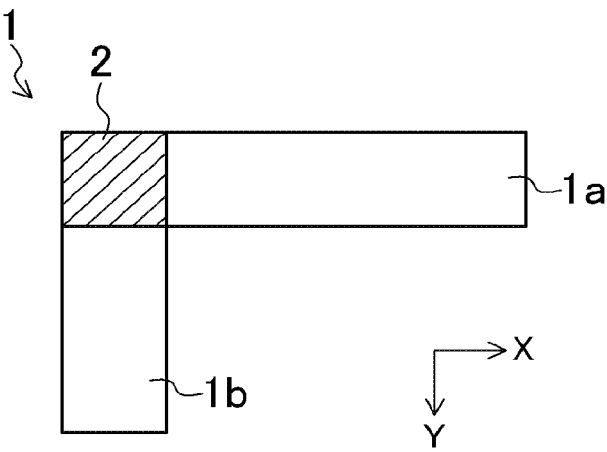
Figure 7:
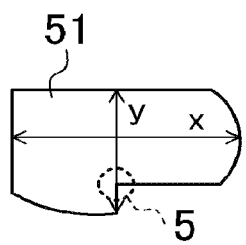
Figure 7:
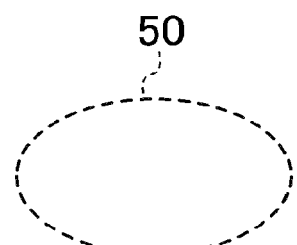

FIG. 7 are plan views illustrating configurations of a wiring and a via under the wiring according to the fourth embodiment. FIG. 7(*a*) is a plan view illustrating arrangement positions and shapes of the wiring 1 and a via 51 under the wiring 1. FIG. 7(*b*) is a plan view illustrating a shape of the wiring 1 only. FIG. 7(*c*) is a plan view illustrating a shape of the via 51 only. FIG. 7(*d*) is a plan view of a via pattern 50 used when a mask for the via 51 is formed at manufacturing a semiconductor device.

In the configuration in FIG. 7, the via 51 as a first via is formed between the wiring 1 as a first wiring and a second wiring (not shown) arranged on a lower layer of the wiring 1. The via 51 is formed by using the via pattern 50 having an elliptical shape larger than the bending portion 2, as shown in FIG. 7(*d*). The via 51 is arranged so as to substantially include the region of the bending portion 2. A shape of the via 51 is determined by an overlapped portion of the wiring 1 and the via pattern 50 by self alignment as in the first embodiment. Therefore, a portion of the via pattern 50 located within the region of the wiring 1 corresponds to the via 51. That is, the ends of the via 51 is the substantially same as those of the via pattern 50 in the first and second wiring regions 1*a*, 1*b*. The ends of the via 51 substantially overlap with the ends of the wiring 1 at the upper side and the left side of the bending portion 2.

Further, in the via 51, the length of the via 51 projecting from the bending portion 2 in the X direction in the wiring region 1*a* is longer than the length of the via 51 projecting from the bending portion 2 in the Y direction in the wiring region 1*b*. That is to say, the via 51 has a shape that the maximum dimension in the X direction (dimension x) is longer than the maximum dimension in the Y direction (dimension y), as shown in FIG. 7(*c*). For example, it is preferable that the dimension x be as 1.5 times or more long as the dimension y. However, the ratio is not limited thereto.

The end of the via 51 projecting in the X direction in the first wiring region 1*a* has a circular arc shape expanding outward. The end of the via 51 projecting in the Y direction in the second wiring region 1*b* has a circular arc shape expanding outward. Further, the via 51 has a notch 5.

According to the embodiment, the via 51 which has a deformed shape with the notch 5 and of which area is sufficiently larger than the bending portion 2 is arranged and formed under the bending portion 2 of the wiring 1. Therefore, an effect of improving the metal filling rate by the large via can be obtained so that the decrease in metal filling rate which is caused by the deformed via shape having a notch can be suppressed.

Modification of Fourth Embodiment

Figure 8:
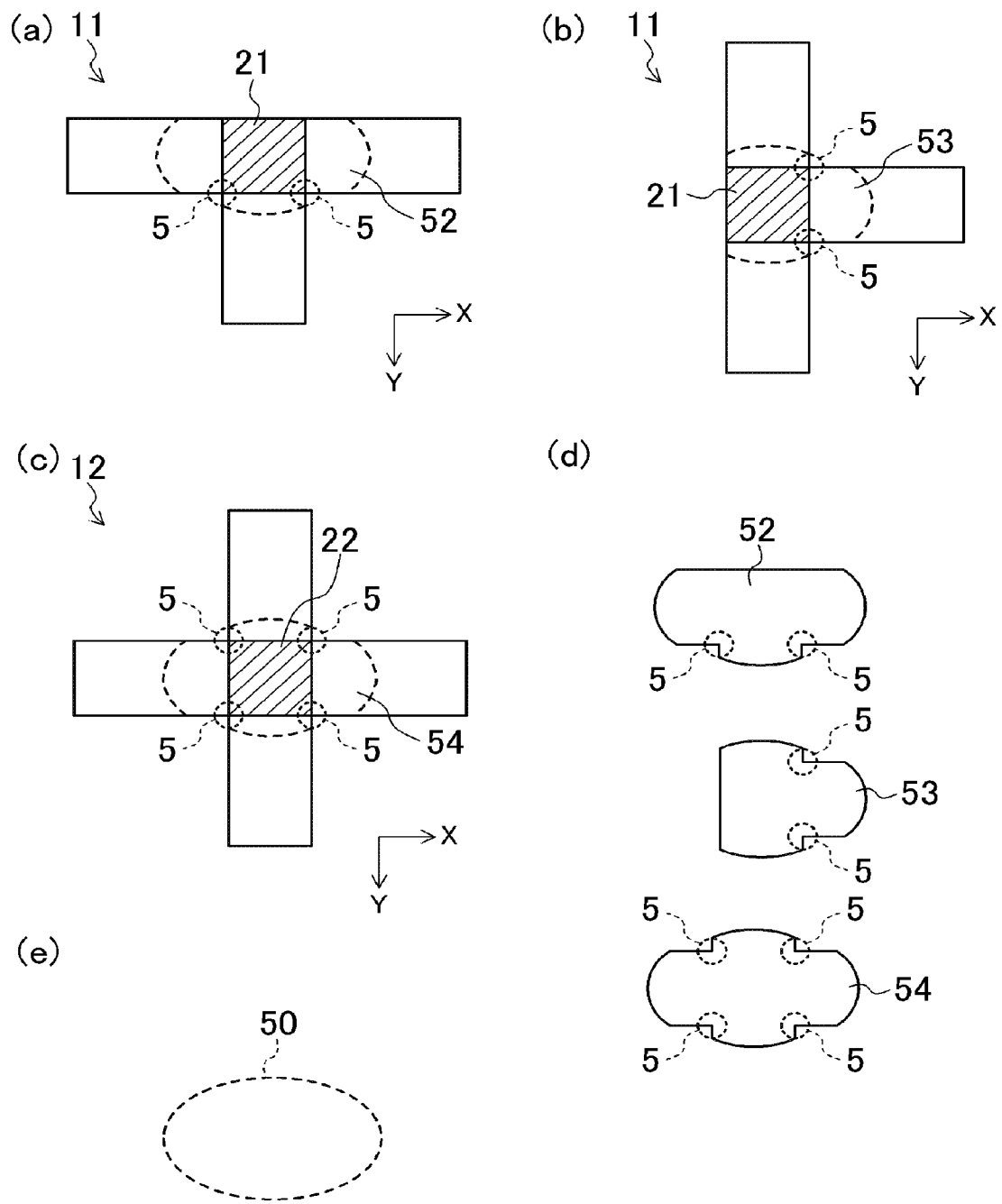
FIG. 8 are plan views illustrating configurations of wirings and vias under the wirings according to a modification of the fourth embodiment.

Although the L-shaped wiring 1 is described as an example in FIG. 7, the same effect can be also obtained by arranging and forming a via in the same manner when a T-shaped wiring 11 as shown in FIGS. 8(*a*) and 8(*b*) or a cross-shaped wiring 12 as shown in FIG. 8(*c*) is employed.

The shape of the T-shaped wiring 11 shown in FIGS. 8(*a*) and 8(*b*) is considered the same as a shape obtained by combining the L-shaped wiring and a wiring formed by rotating the L-shaped wiring by 90 degree so as to overlap the bending portions 21 thereof. Vias 52, 53 are formed as shown in FIG. 8(*d*) by arranging the via pattern 50 shown in FIG. 8(*e*) so as to include the region of the bending portions 21 in the wiring 11. The shape of the cross-shaped wiring 12 shown in FIG. 8(*c*) is considered the same as a shape obtained by combining the T-shaped wiring and a wiring formed by rotating the T-shaped wiring by 180 degree so as to overlap the bending portions 22 thereof. A via 54 is formed as shown in FIG. 8(*d*)

by arranging the via pattern 50 shown in FIG. 8(*e*) so as to include the region of the bending portion 22 of the wiring 12.

Figure 9:
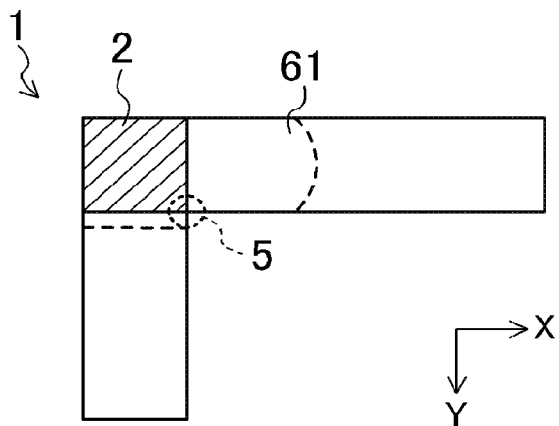
FIG. 9 are plan views illustrating configurations of a wiring and a via under the wiring according to the fourth embodiment.
Figure 9:
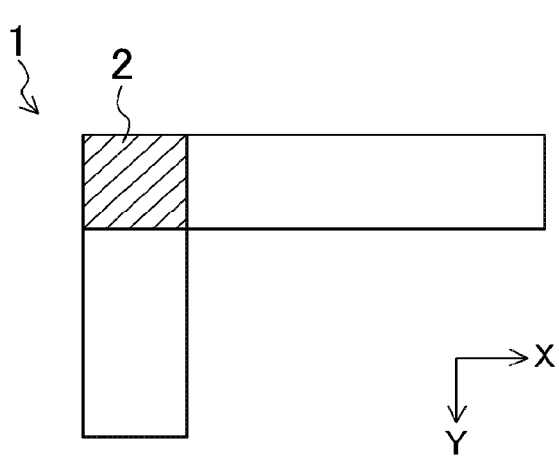
Figure 9:
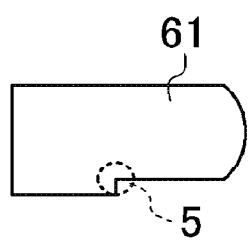
Figure 9:
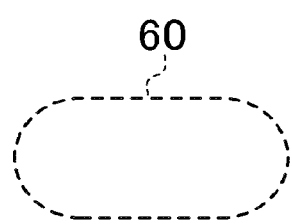
Figure 10:
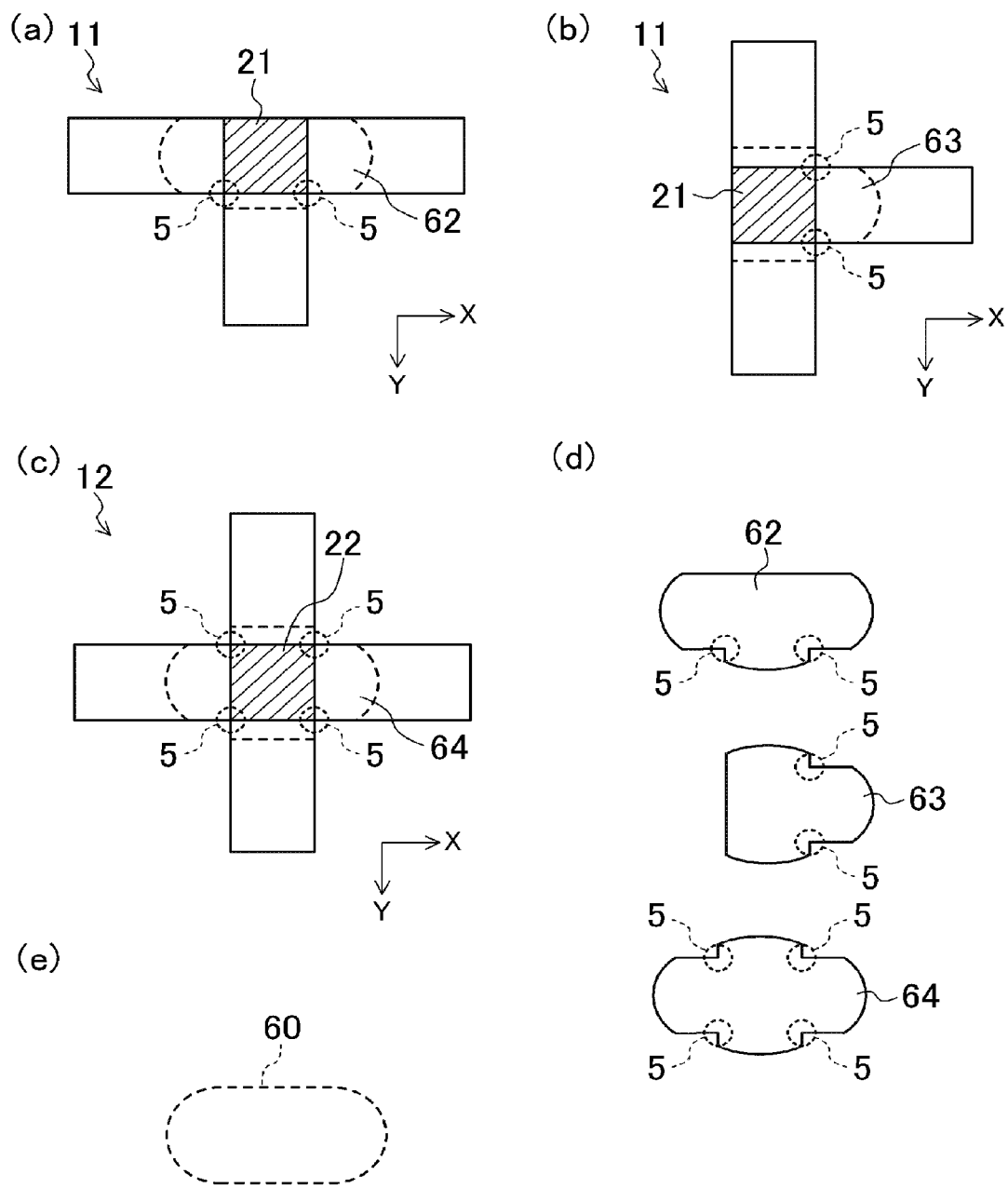
FIG. 10 are plan views illustrating configurations of wirings and vias under the wirings according to the fourth embodiment.
Figure 11:
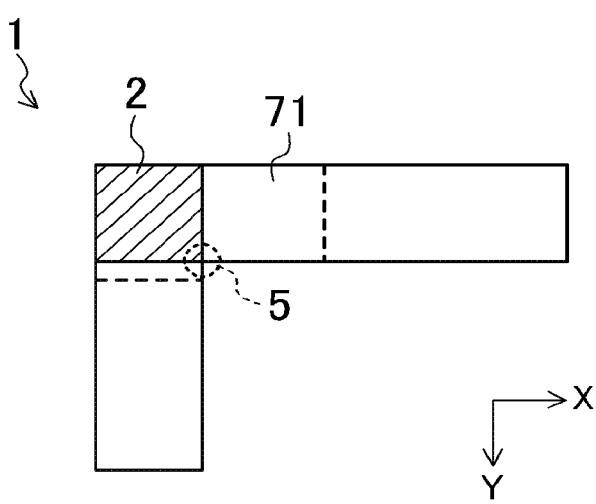
FIG. 11 are plan views illustrating configurations of a wiring and a via under the wiring according to the fourth embodiment.
Figure 11:
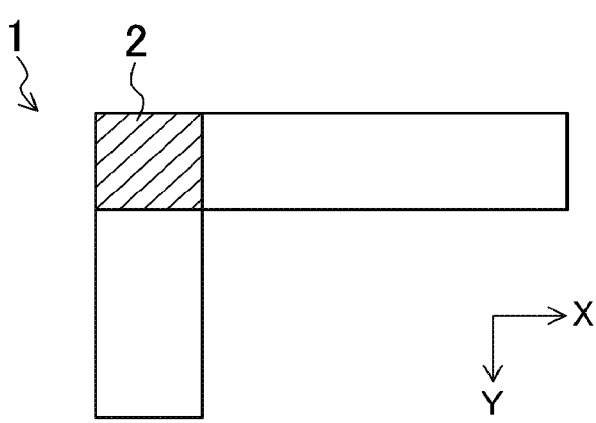
Figure 11:
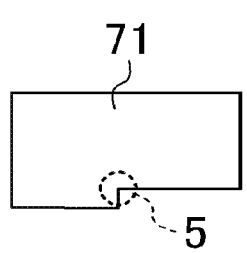
Figure 11:
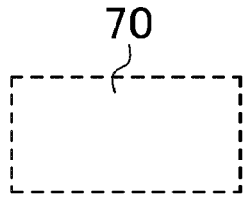

Further, although the elliptical via pattern 50 is described as an example in the embodiment, the shape of the via pattern is not limited thereto. For example, in FIG. 9, a via 61 is formed as shown in FIGS. 9(*a*) and 9(*c*) by applying an oval-shaped via pattern 60 shown in FIG. 9(*d*) to the wiring 1 shown in FIG. 9(*b*). In FIG. 10, vias 62, 63, 64 are formed as shown in FIGS. 10(*a*) to 10(*d*) by applying the oval-shaped via pattern 60 shown in FIG. 10(*e*) to the T-shaped wiring 11 or the cross-shaped wiring 12. Alternatively, in FIG. 11, a via 71 is formed as shown in FIGS. 11(*a*) and 11(*c*) by applying a rectangular via pattern 70 shown in FIG. 11(*d*) to the wiring 1 shown in FIG. 11(*b*). The same effect as in the above fourth embodiment can be obtained with these configurations.

Fifth Embodiment

Here, in order to make the description understood easily, a via according to the embodiment which is different from the conventional via is referred to as "via" and other vias which are the same as the conventional via are referred to as "contact" in the layout of a basic cell and a semiconductor integrated circuit device. It is true in the subsequent description.

Figure 12:
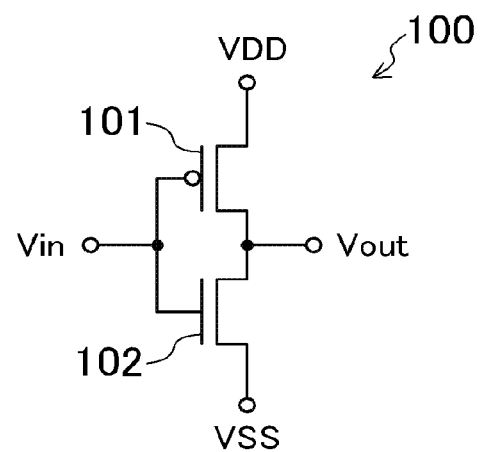
FIG. 12 are views of a basic cell.
Figure 12:
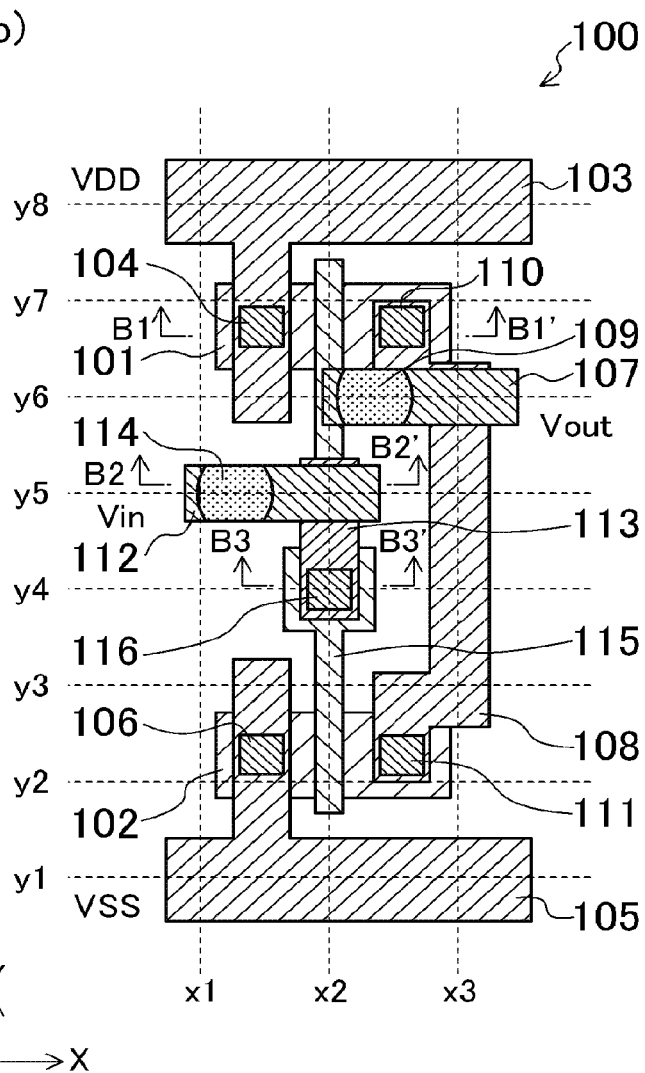

FIG. 12(*a*) is a circuit diagram illustrating a CMOS inverter 100 composed of a p-channel transistor 101 and an n-channel transistor 102. An input signal Vin is commonly input to each gate of the p-channel transistor 101 and the n-channel transistor 102 and an output signal Vout is taken from a drain of the p-channel transistor 101 and a drain of the re-channel transistor 102 which are commonly connected.

FIG. 12(*b*) is a layout view illustrating a plane configuration of a basic cell realizing the CMOS inverter 100 in FIG. 12(*a*). In FIG. 12(*b*), a power-source wiring 103 supplying a source voltage VDD is connected to a source of the p-channel MOS transistor 101 through a fist contact 104 while a ground wiring 105 supplying a ground source VSS to a source of the n-channel MOS transistor 102 through a second contact 106.

A first output signal line 107 which outputs the output signal Vout from the CMOS inverter 100 is a terminal configured to transmit the output signal Vout. Further, the first output signal line 107 is connected to a second output signal line 108 through a first via 109. The second output signal line 108 is connected to the drain of the p-channel MOS transistor 101 through a third contact 110 and is connected to the drain of the n-channel MOS transistor 102 through a fourth contact 111. A first input signal line 112 which inputs the input signal Vin to the CMOS inverter 100 is a terminal configured to transmit the input signal Vin. Further, the first input signal line 112 is connected to a second input signal line 113 through a second via 114. The second input signal line 113 is connected to a gate electrode 115 which is common to the p-channel MOS transistor 101 and the n-channel MOS transistor 102 through a fifth contact 116.

In FIG. 12(*b*), x1 to x3 are wiring grids lined in the X direction, y1 to y8 are wiring grids lined in the Y direction. The wiring grids are used for arrangement wiring. Further, the first via 109 is arranged under a first output signal line 107 at a position apart from an intersection of the wiring grids x3 and y6 to the left side in the X direction and the second via 114 is arranged under the first input signal line 112 at a position apart from an intersection of the wiring grids x2 and y5 to the left side in the X direction, in FIG. 12(*b*).

Figure 2:
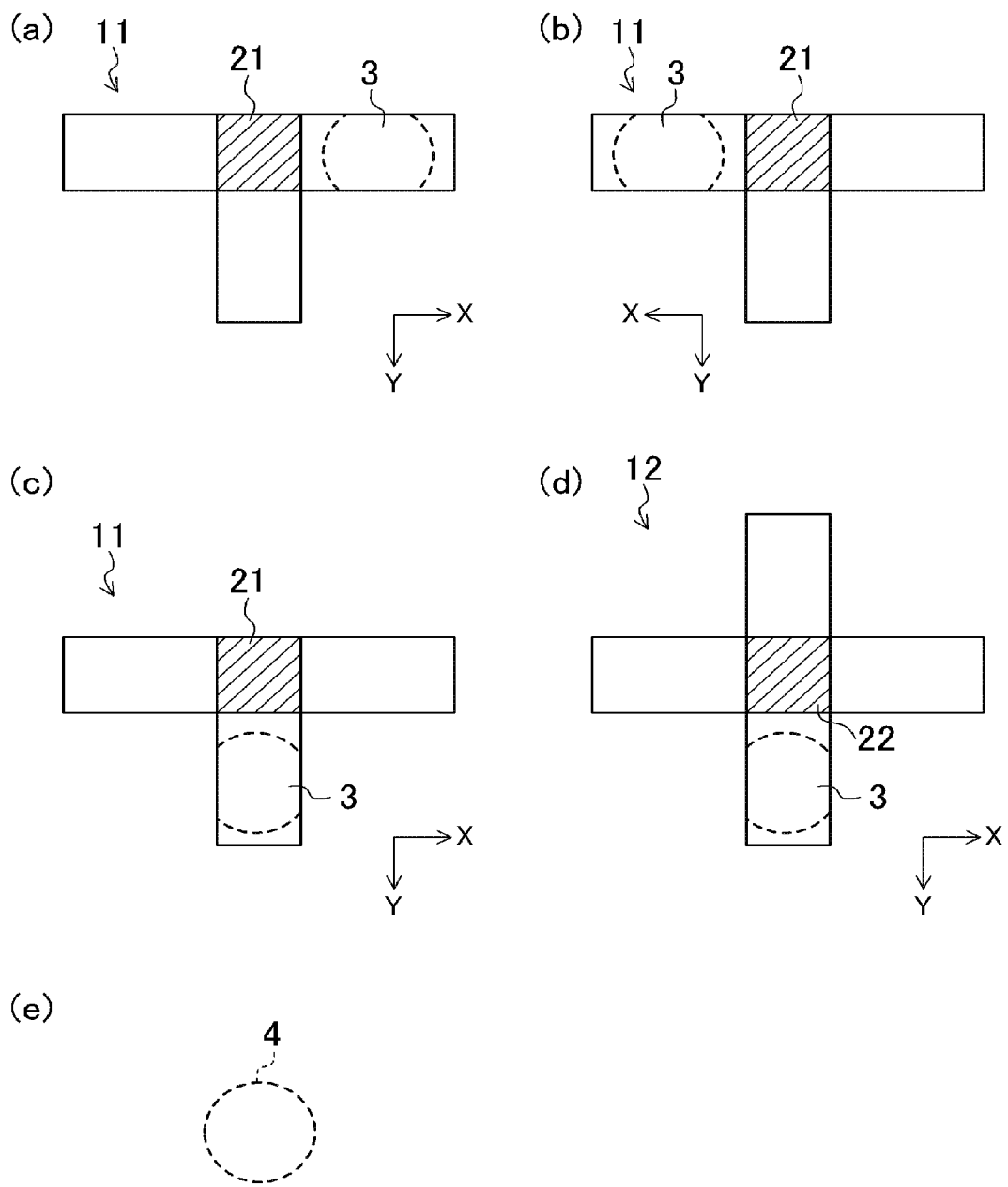
FIG. 2 are plan views illustrating configurations of wirings and a via under the wirings according to a modification of the first embodiment.

The first and second vias 109, 114 in FIG. 12(*b*) have the same shape as the via 3 in FIG. 1 and FIG. 2 shown in the first embodiment in a practical semiconductor device using the basic cell 100.

Figure 13:
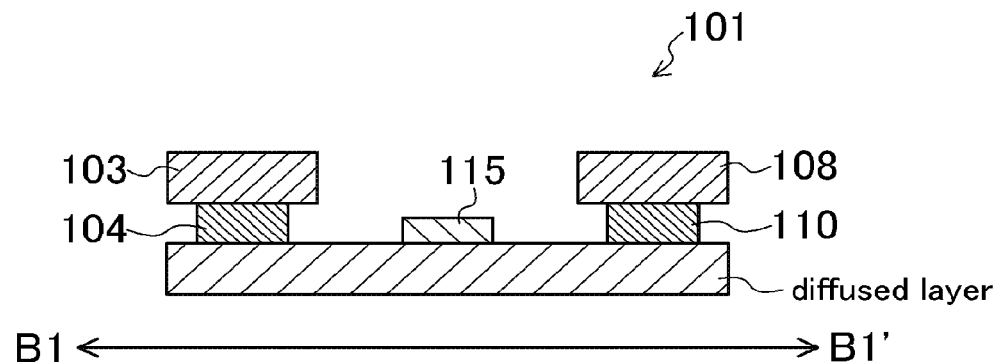
FIGS. 13(a) to 13(c) are cross sectional views of the basic cell in FIG. 12(b).
Figure 13:
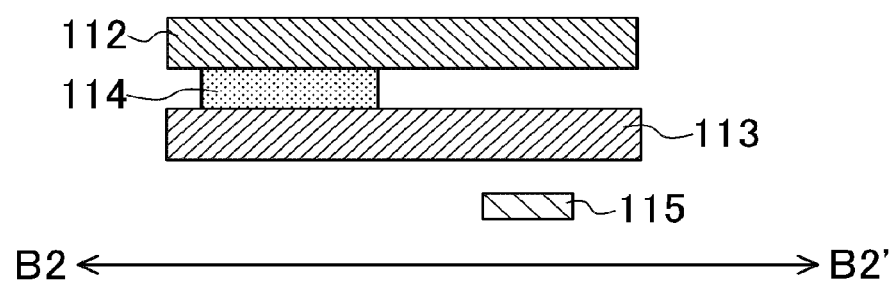
Figure 13:
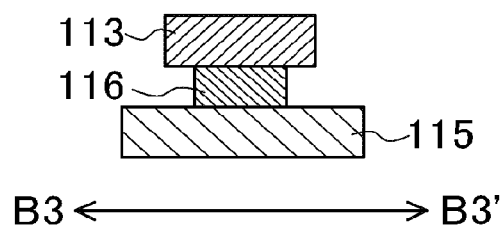

FIG. 13 are cross sectional views of the basic cell in FIG. 12(*b*). FIG. 13(*a*) is a cross sectional view illustrating a cross section cut along a line B1-B1' of FIG. 12(*b*). FIG. 13(*b*) is a cross sectional view illustrating a cross section cut along a line B2-B2' of FIG. 12(*b*). FIG. 13(*c*) is a cross sectional view illustrating a cross section cut along a line B3-B3' of FIG. 12(*b*).

Figure 14:
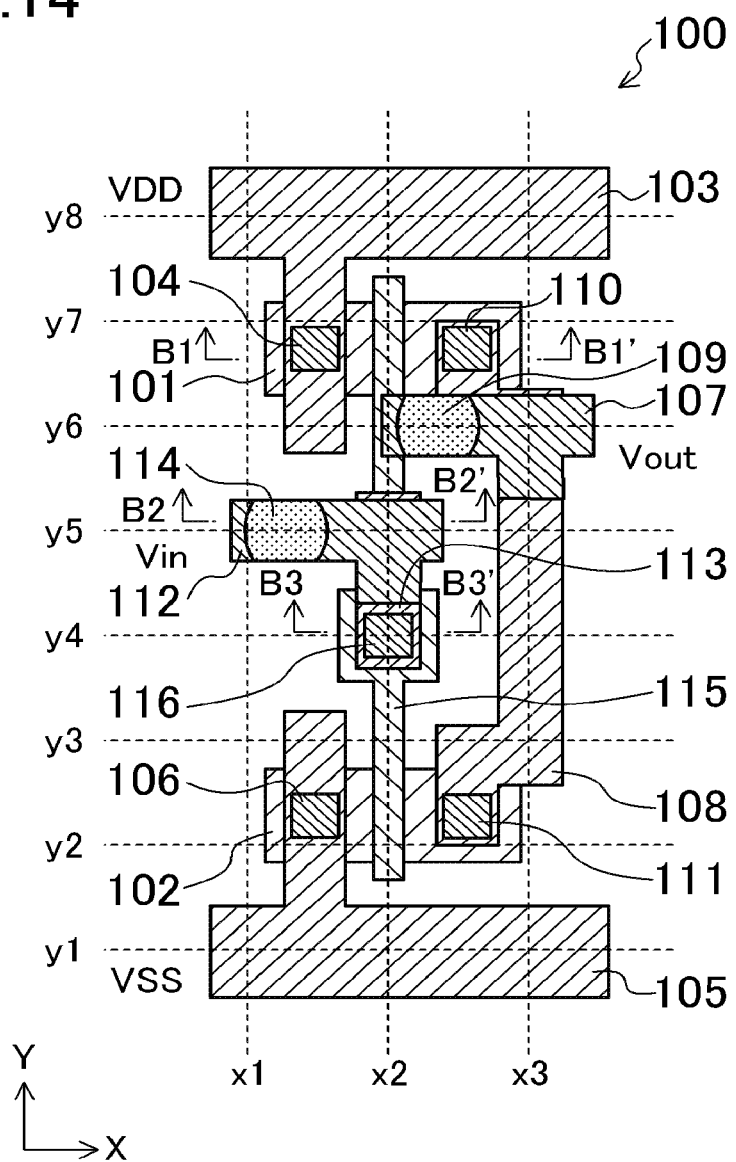
FIG. 14 is a plan view of a basic cell according to a fifth embodiment.

FIG. 14 is a layout view illustrating a plane configuration of a basic cell according to the embodiment. The layout in FIG. 14 is substantially the same as that in FIG. 12(*b*). However, each of the first output signal line 107 and the first input signal line 112 has a bending portion in FIG. 14. The first via 109 is formed between the first output signal line 107 as a first wiring having a bending portion and the second output signal line 108 as a second wiring. The second via 114 is formed between the first input signal line 112 as a first wiring having a bending portion and the second input signal line 113 as a second wiring. That is to say, a via according to the embodiment is formed under the wiring having a bending portion.

Figure 15:
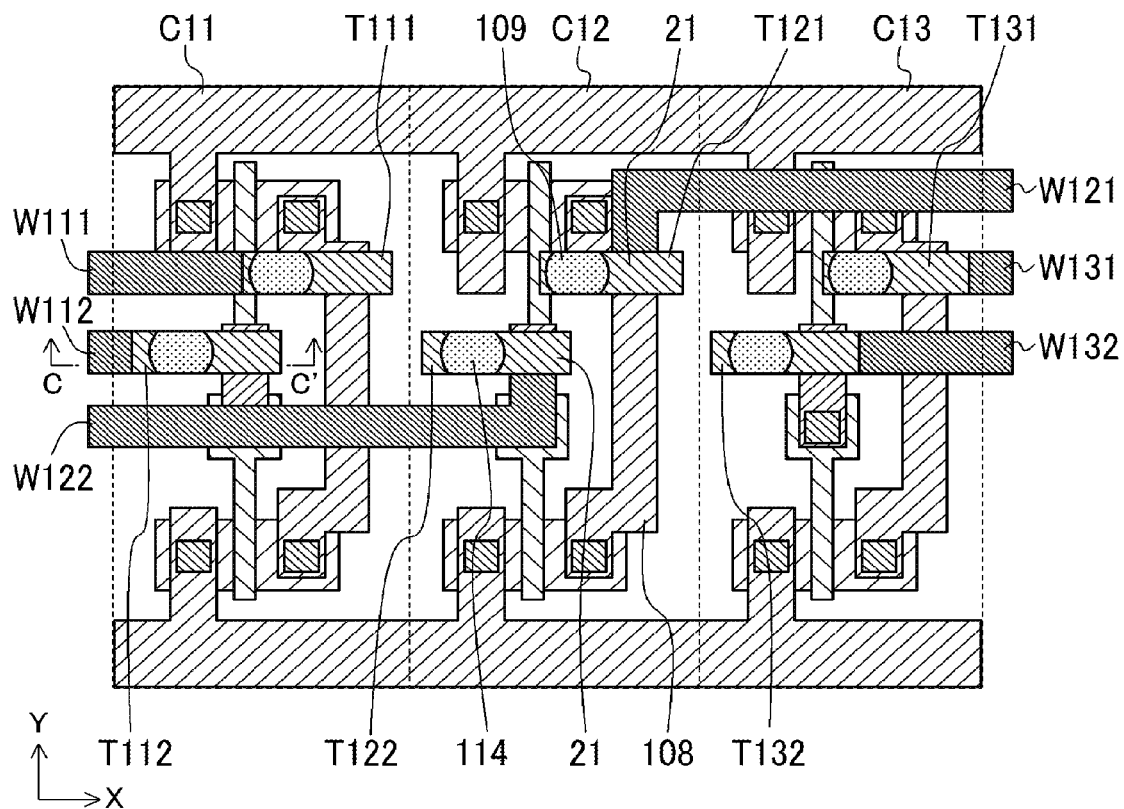
FIG. 15 are views illustrating a configuration of a semiconductor integrated circuit device according to the fifth embodiment using the basic cell of FIG. 12 and FIG. 13.
Figure 15:
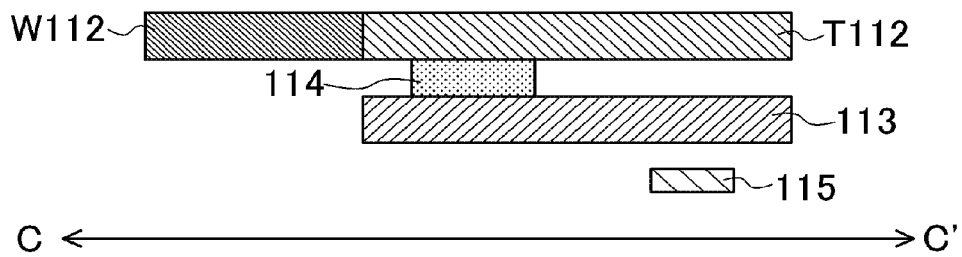

FIG. 15(*a*) is a layout view of a semiconductor integrated circuit device according to the embodiment in which arrangement wiring is performed by using the basic cell 100 in FIG. 12(*b*). FIG. 15(*b*) is a cross sectional view illustrating a cross section cut along a line C-C' of the layout view in FIG. 15(*a*).

In FIG. 15(*a*), C11, C12, C13 denote basic cells. T111, T121, T131 denote first output signal lines which are terminals configured to transmit the output signals Vout of the basic cells C11, C12, C13, respectively. T112, T122, T132 denote first input signal lines which are terminals configured to transmit the input signals Vin of the basic cells C11, C12, C13, respectively. Further, W111, W121, W131 denote signal wirings which are formed on the same layer on which the first output signal lines T111, T121, T131 are formed, and are connected to the first output signal lines T111, T121, T131, respectively. W112, W122, W132 denote signal wirings which are formed on the same layer on which the first input signal lines T112, T122, T132 are formed, and are connected to the first input signal lines T112, T122, T132, respectively.

In FIG. 15(*a*), in the basic cell C11 provided at the left side, the signal wiring W111 connected to the first output signal line T111 and the signal wiring W112 connected to the first input signal line T112 are connection-wired from the left side in the X direction (transverse direction in the drawing) of the cell. In the same manner, in the basic cell C13 provided at the right side, the signal wiring W131 connected to the first output signal line T131 and the signal wiring W132 connected to the first input signal line T132 are connection-wired from the right side in the X direction of the cell.

However, in the basic cell C12 provided at the middle, the signal wiring W121 connected to the first output signal line T121 and the signal wiring W122 connected to the first input signal line T122 cannot be connection-wired from any of the left and right sides in the X direction so as not to overlap with the signal wirings W111, W112, W131, W132. Therefore, the signal wiring W121 is connected to the first output signal line T121 from the upper side in the Y direction and the signal wiring W122 is connected to the first input signal line T122 from the lower side in the Y direction. When the wirings are connection-wired in such a manner, bending portions are formed on a connection between the first output signal line T121 and the signal wiring W121 and a connection between the first input signal line T122 and the signal wiring W122

Here, even if the signal wiring W121 is connected to the first output signal line T121 from the lower side in the Y direction and the signal wiring W122 is connected to the first output signal line T122 from the upper side in the Y direction, bending portions are formed on a connection between the first output signal line T121 and the signal wiring W121 and a connection between the first input signal line T122 and the signal wiring W122 as described above.

However, arrangement positions of the first via 109 and the second via 114 with respect to the bending portion 21 in the basic cell C12 meets a restriction of arrangement position described in the first embodiment. That is to say, the first via 109 has the same arrangement position and shape as the via 3 in FIG. 1 to FIG. 3 under the wirings T121, W121 having the bending portions 21. The second via 114 has the same arrangement position and shape as the via 3 in FIG. 1 to FIG. 3 under the wirings T122, W122 having the bending portions 21.

According to the embodiment, when the arrangement wiring is performed by using the basic cell, a via is not arranged and formed under the bending portion 21 at the connection of the wirings as described above. Therefore, the vias 109, 114 can be formed so as not to have the notch 5 which is formed on the conventional via 31 in FIG. 25(d). This makes it possible to suppress the decrease in metal filling rate which is caused by the deformed via shape.

Sixth Embodiment

Figure 16:
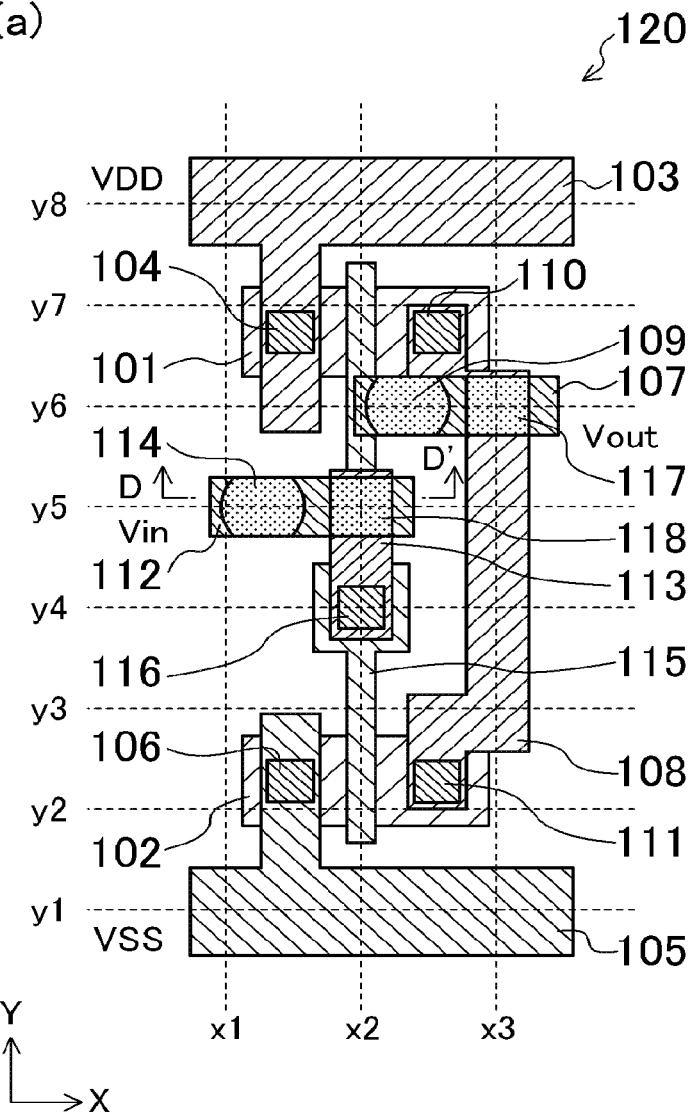
FIG. 16 are views of a basic cell.
Figure 16:
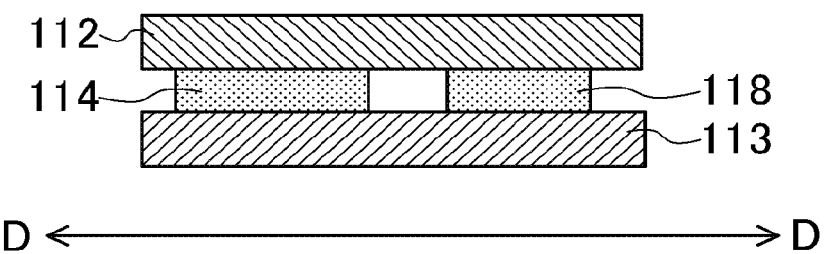

FIG. 16 are views illustrating a configuration of a basic cell 120 realizing the CMOS inverter 100 shown in FIG. 12(a). FIG. 16(a) is a layout view illustrating a plane configuration. FIG. 16(b) is a cross sectional view illustrating a cross section cut along a line D-D' in FIG. 16(a). The configuration in FIG. 16 is the same as those in FIG. 12 and FIG. 13 except the following point. That is, a third via 117 and a fourth via 118 are arranged in addition to the first and second vias 109, 114 in FIG. 16.

The third and fourth vias 117, 118 have a simplified via shape of square in FIG. 16. However, in the practical semiconductor device using the basic cell 120, the third and fourth vias 117,118 have a shape having the notch 5 as the via 32 in FIG. 4 as described in the second embodiment.

Figure 17:
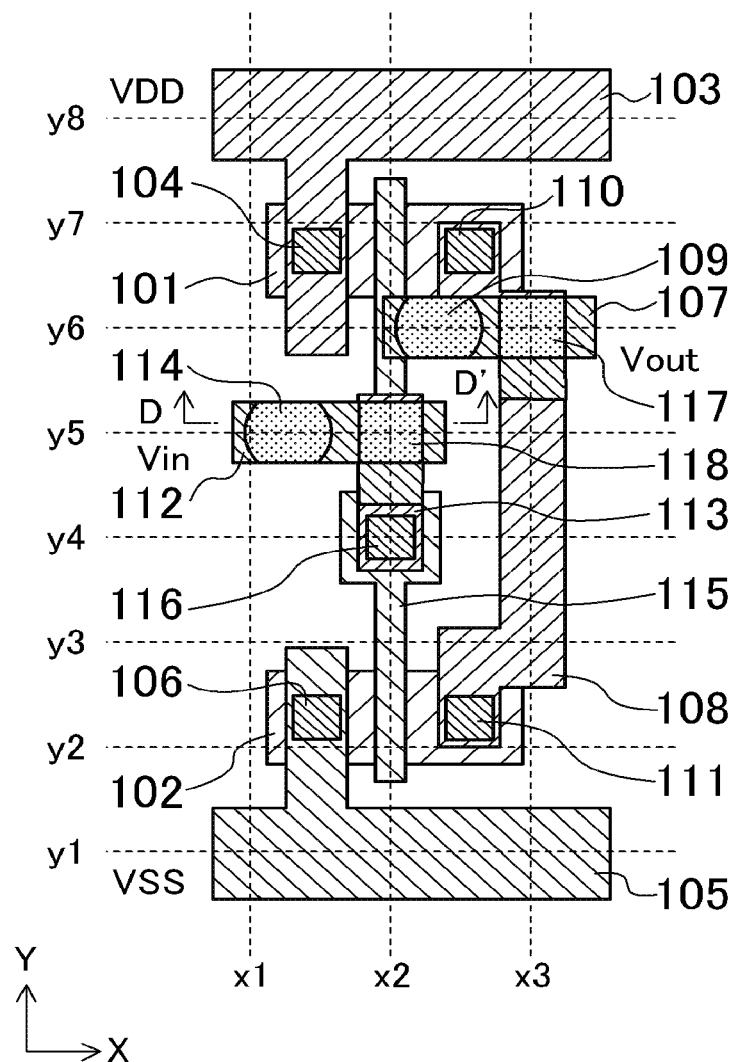
FIG. 17 is a plan view of a basic cell according to a sixth embodiment.

FIG. 17 is a layout view illustrating a plane configuration of the basic cell according to the embodiment. The layout in FIG. 17 is substantially the same as that in FIG. 16(a). However, the first output signal line 107 above the first via 109 has a bending portion and the first input signal line 112 above the second via 114 has a bending portion in FIG. 17. That is to say, vias according to the embodiment are formed under the wirings having bending portions.

Figure 18:
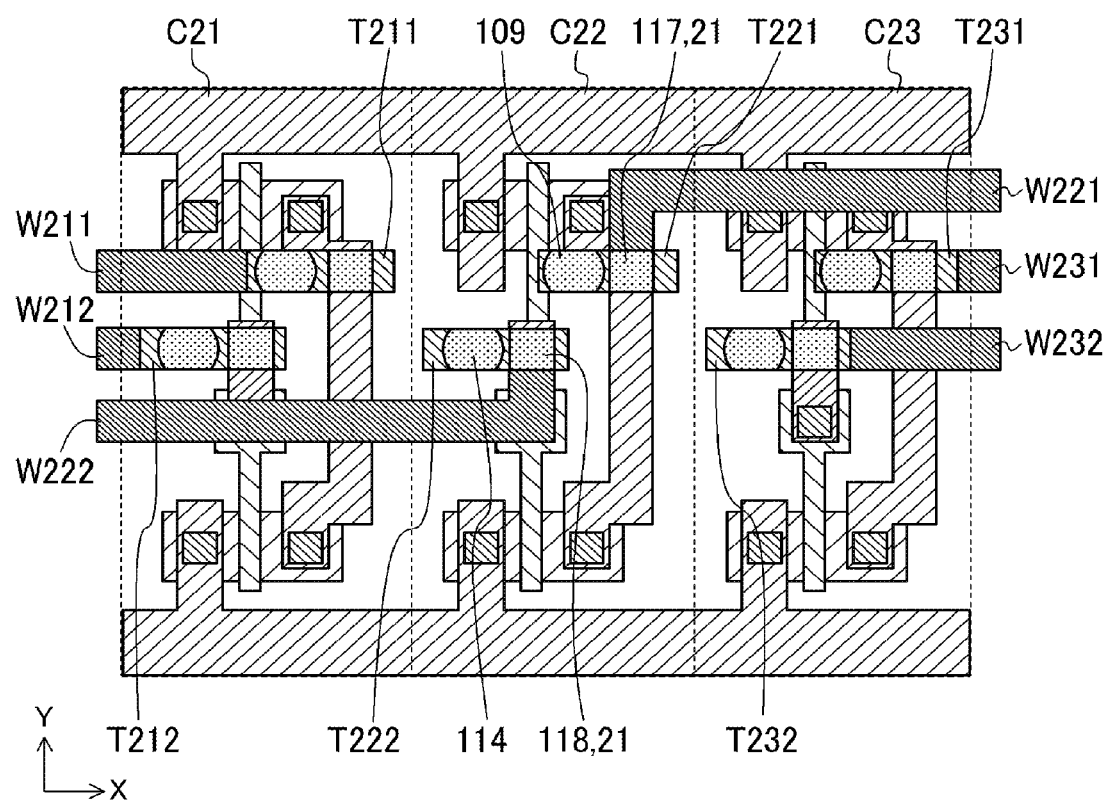
FIG. 18 is a plan view of a semiconductor integrated circuit device according to the sixth embodiment using the basic cell in FIG. 16.

FIG. 18 is a layout view of a semiconductor integrated circuit device according to the embodiment in which arrangement wiring is performed by using the basic cell 120 in FIG. 16. In FIG. 18, C21, C22, C23 denote basic cells, T211, T221, T231 denote first output signal lines which are terminals configured to transmit the output signals Vout of the basic cells C21, C22, C23, respectively. T212, T222, T232 denote first input signal lines which are terminals configured to transmit the input signals Vin of the basic cells C21, C22, C23, respectively. Further, W211, W221, W231 denote signal wirings which are formed on the same layer on which the first output signal lines T211, T221, T231 are formed, and are connected to the first output signal lines T211, T221, T231, respectively. W212, W222, W232 denote signal wirings which are formed on the same layer on which the first input signal lines T212, T222, T232 are formed, and are connected to the first input signal lines T212, T222, T232, respectively.

In FIG. 18, the signal wiring W221 is connected to the first output signal line T221 from the upper side in the Y direction and the signal wiring W222 is connected to the first input signal line T222 from the lower side in the Y direction in the same manner as in FIG. 15(a). When the wirings are connection-wired in such a manner, bending portions 21 are formed on a connection between the first output signal line T221 and the signal wiring W221 and a connection between the first input signal line T222 and the signal wiring W222. Further, the third and fourth vias 117, 118 are formed under the bending portions 21.

According to the embodiment, when the arrangement wiring is performed by using the basic cell, the deformed-shaped third and fourth vias 117, 118 having notches are arranged and formed under the bending portions 21 at the connection of the wirings while the redundant first and second vias 109, 114 having no notch are arranged and formed as described above. This makes it possible to suppress the decrease in metal filling rate which is caused by the deformed shape.

Seventh Embodiment

Figure 19:
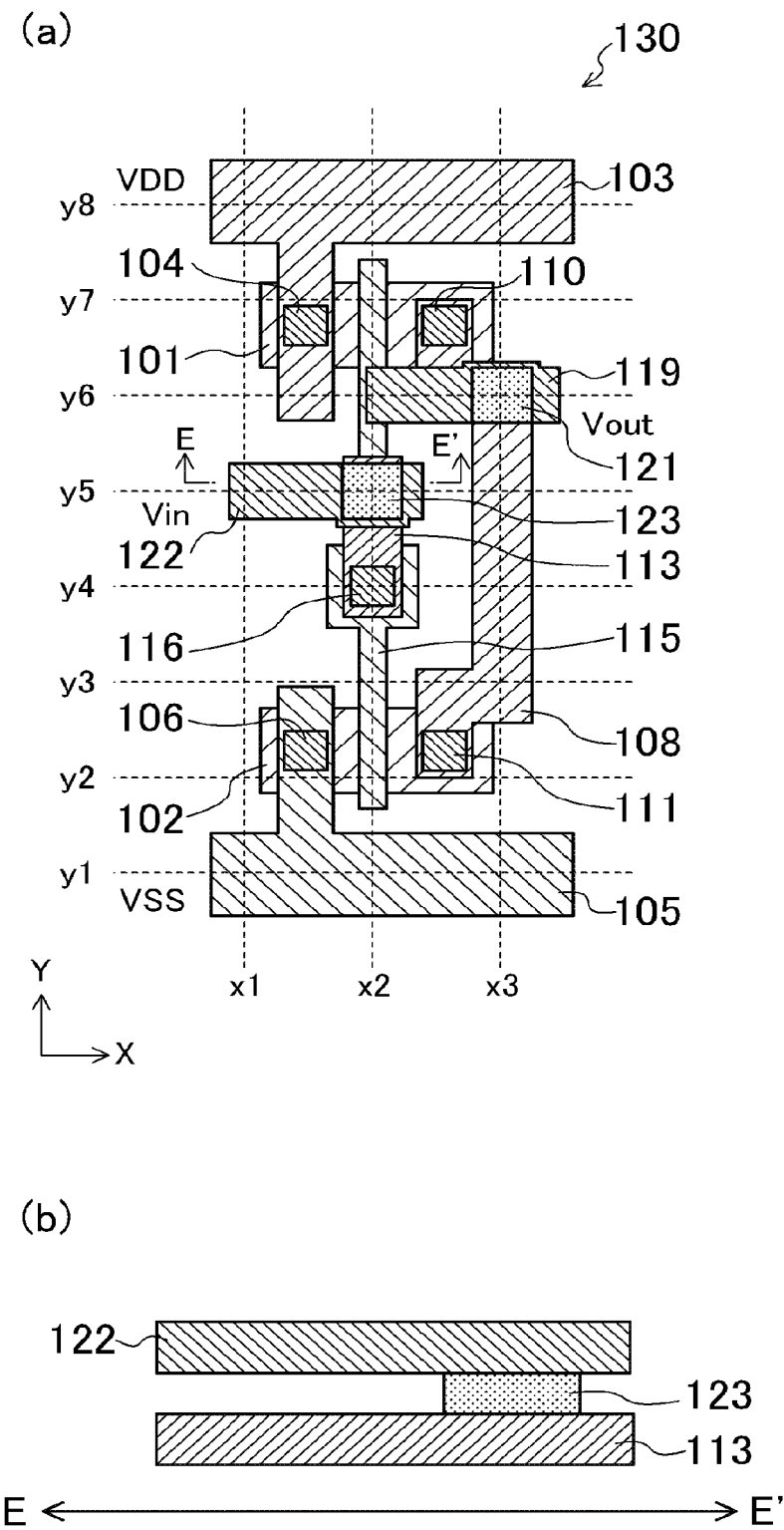
FIG. 19 are views of a basic cell.

FIG. 19 are views illustrating a configuration of a basic cell 130 realizing the CMOS inverter 100 shown in FIG. 12(a). FIG. 19(a) is a layout view illustrating a plane configuration. FIG. 19(b) is a cross sectional view illustrating a cross section cut along a line E-E' in FIG. 19(a). The configuration in FIG. 19 is the same as those in FIG. 12 and FIG. 13 except the following points. That is, a first output signal line 119 and a first input signal line 122 are provided in FIG. 19 in place of the first output signal line 107 and the first input signal line 112. Further, first and second vias 121, 123 having a shape described in the third embodiment are provided in FIG. 19 in place of the first and second vias 109, 114.

The first and second vias 121, 123 have a simplified via shape of square in FIG. 19. However, in the practical semiconductor device using the basic cell 130, the first and second vias 121, 123 have a shape having no notch as in the via 42 in FIG. 6 as described in the third embodiment.

Figure 20:
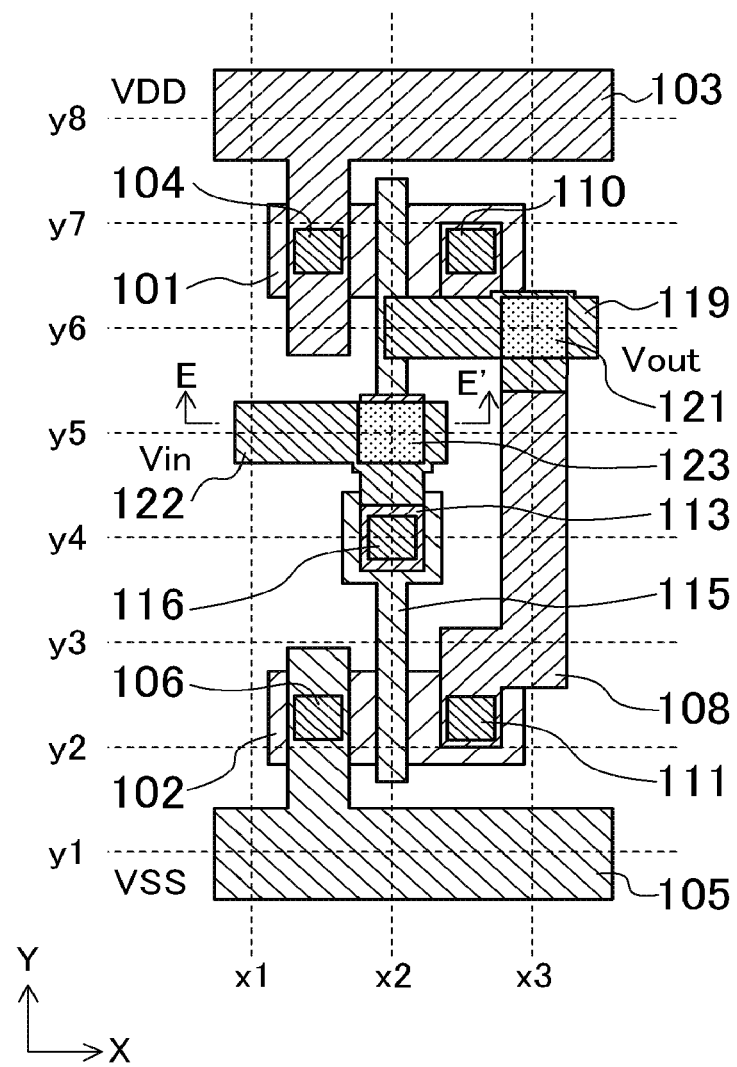
FIG. 20 is a plan view of a basic cell according to a seventh embodiment.

FIG. 20 is a layout view illustrating a plane configuration of the basic cell according to the embodiment. The layout in FIG. 20 is the substantially same as that in FIG. 19(a). However, both the first output signal line 119 and the first input signal line 122 have a bending portion. The first via 121 is formed between the first output signal line 119 as a first wiring having a bending portion and the second output signal line 108 as a second wiring. The second via 123 is formed between the first input signal line 122 as a first wiring having a bending portion and the second input signal line 113 as a second wiring. That is to say, vias according to the embodiment are formed under the wirings having bending portions. Further, each of the first output signal line 119 and the first input signal line 122 have a projection described in the third embodiment.

Figure 21:
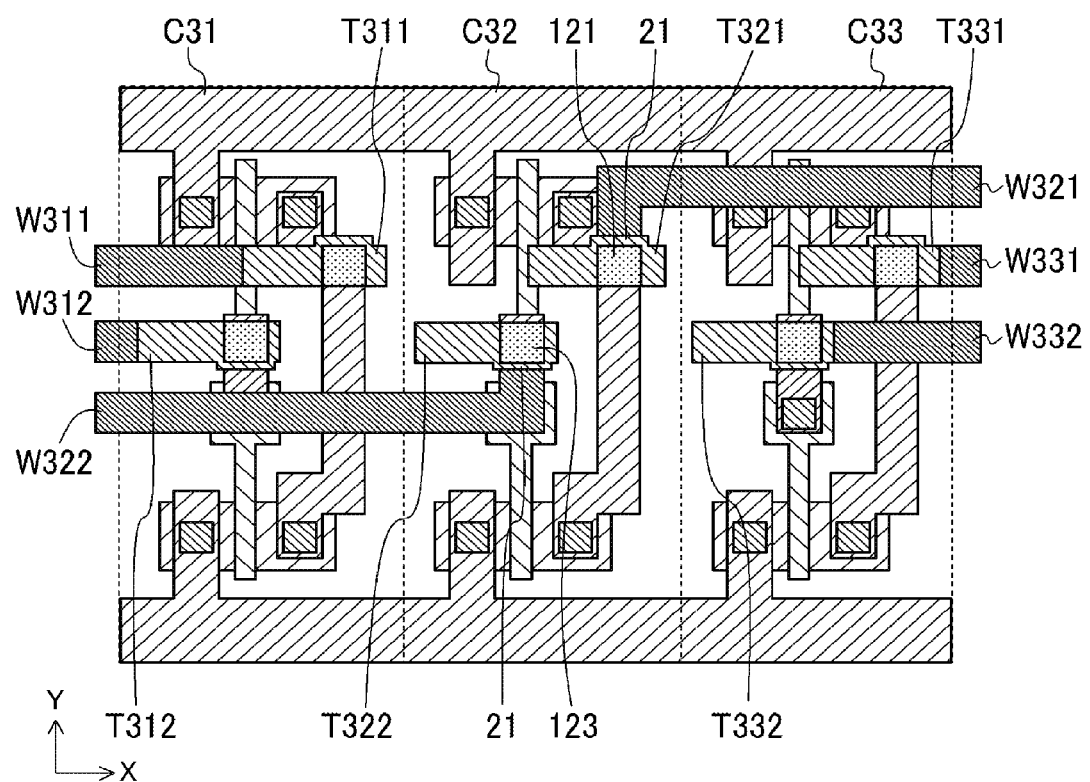
FIG. 21 is a view illustrating a configuration of a semiconductor integrated circuit device according to the seventh embodiment using the basic cell in FIG. 19.

FIG. 21 is a layout view of the semiconductor integrated circuit device according to the embodiment in which arrangement wiring is performed by using the basic cell 130 shown in FIG. 19. In FIG. 21, C31, C32, C33 denote basic cells, T311, T321, T331 denote first output signal lines which are terminals configured to transmit the output signals Vout of the basic cells C31, C32, C33, respectively, T312, T322, T332 denote first input signal lines which are terminals configured to transmit the input signals Vin of the basic cells C31, C32, C33, respectively. Further, W311, W321, W331 denote signal wirings which are formed on the same layer on which the first output signal lines T311, T321, T331 are formed, and are connected to the first output signal lines T311, T321, T331, respectively. W312, W322, W332 denote signal wirings which are formed on the same layer on which the first input signal lines T312, T322, T332 are formed, and are connected to the first input signal lines T312, T322, T332.

In FIG. 21, the signal wiring W321 is connected to the first output signal line T321 from the upper side in the Y direction and the signal wiring W322 is connected to the first input signal line T322 from the lower side in the Y direction as in FIG. 15(a). When the wirings are connection-wired in such a manner, bending portions 21 are formed on a connection between the first output signal line T321 and the signal wiring W321 and a connection between the first input signal line T322 and the signal wiring W322. Further, the first and second vias 121, 123 are formed under the bending portions 21. Each of the wiring composed of the first output signal line T321 and the signal wiring W321 and the wiring composed of the first input signal lines T322 and the signal wiring W322 has a projection described in the third embodiment.

According to the embodiment, when the arrangement wiring is performed by using the basic cell, the first and second vias 121, 123 having no notch are arranged and formed under the bending portions 21 at the connection of the wirings as described above. This makes it possible to suppress the decrease in metal filling rate which is caused by the deformed via shape.

Eighth Embodiment

Figure 22:
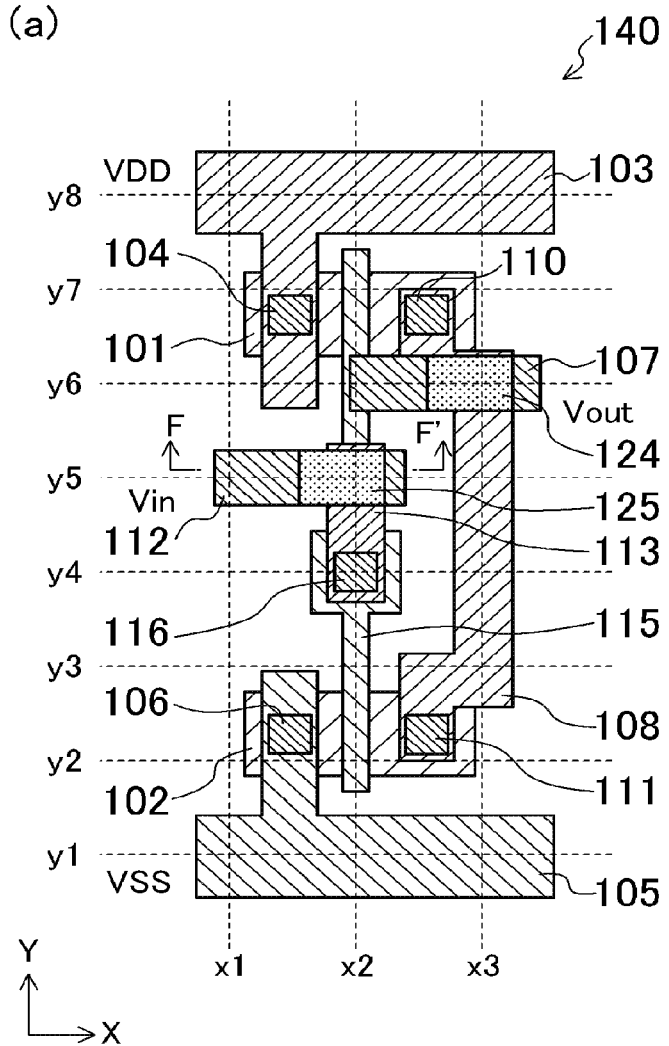
FIG. 22 are views of a basic cell.
Figure 22:
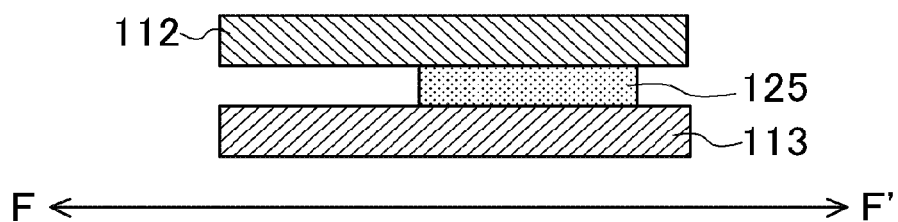

FIG. 22 are views illustrating a configuration of a basic cell 140 realizing the CMOS inverter 100 shown in FIG. 12(a). FIG. 22(a) is a layout view illustrating a plane configuration. FIG. 22(b) is a cross sectional view illustrating a cross section cut along a line F-F' in FIG. 22(a). The configuration in FIG. 22 is the same as those in FIG. 12 and FIG. 13 except the following point. That is, a first and second vias 124, 125 having a shape shown in the fourth embodiment are provided in place of the first and second vias 109, 114 in FIG. 22.

The first and second vias 124, 125 have a simplified via shape of rectangle in FIG. 22. However, in the practical semiconductor device using the basic cell 140, the first and second vias 124, 125 have a shape having the notch but having the length in the X direction longer than that in the Y direction as the via 51 in FIG. 7 described in the fourth embodiment.

Figure 23:
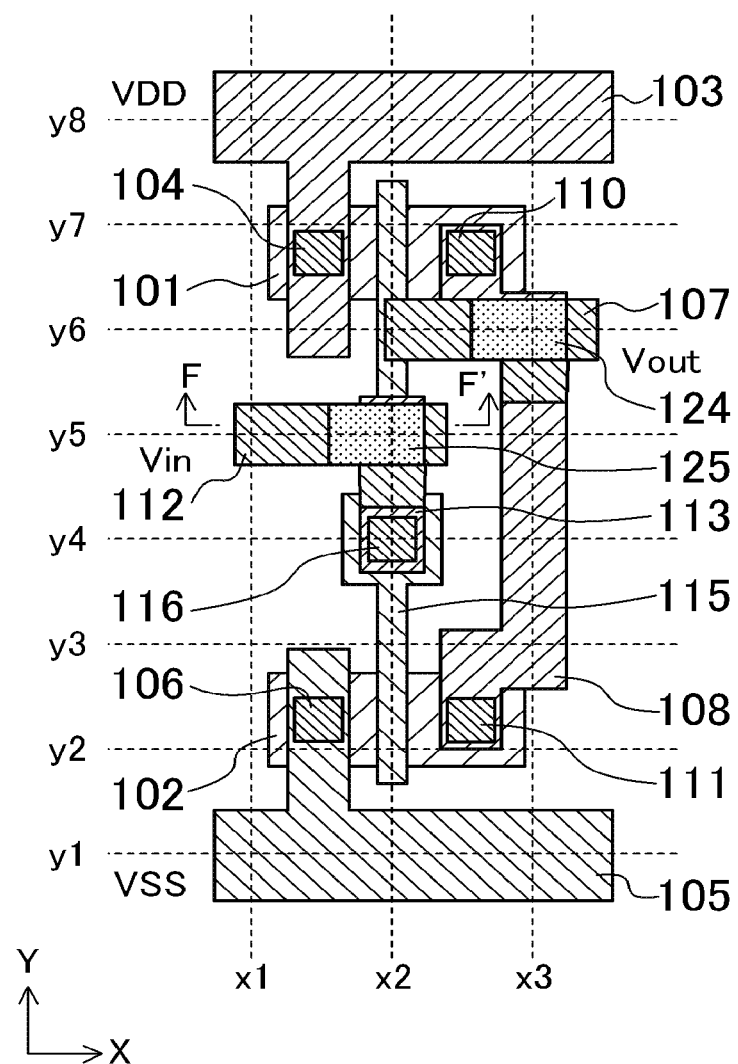
FIG. 23 is a plan view of a basic cell according to an eighth embodiment.

FIG. 23 is a layout view illustrating a plane configuration of the basic cell according to the embodiment. The layout in FIG. 23 is substantially the same as that in FIG. 22(a). However, both the first output signal line 107 and the first input signal line 112 have a bending portion. The first via 124 is formed between the first output signal line 107 as a first wiring having a bending portion and the second output signal line 108 as a second wiring. The second via 125 is formed between the first input signal line 112 as a first wiring having a bending portion and the second input signal line 113 as a second wiring. That is to say, vias according to the embodiment are formed under the wirings having bending portions.

Figure 24:
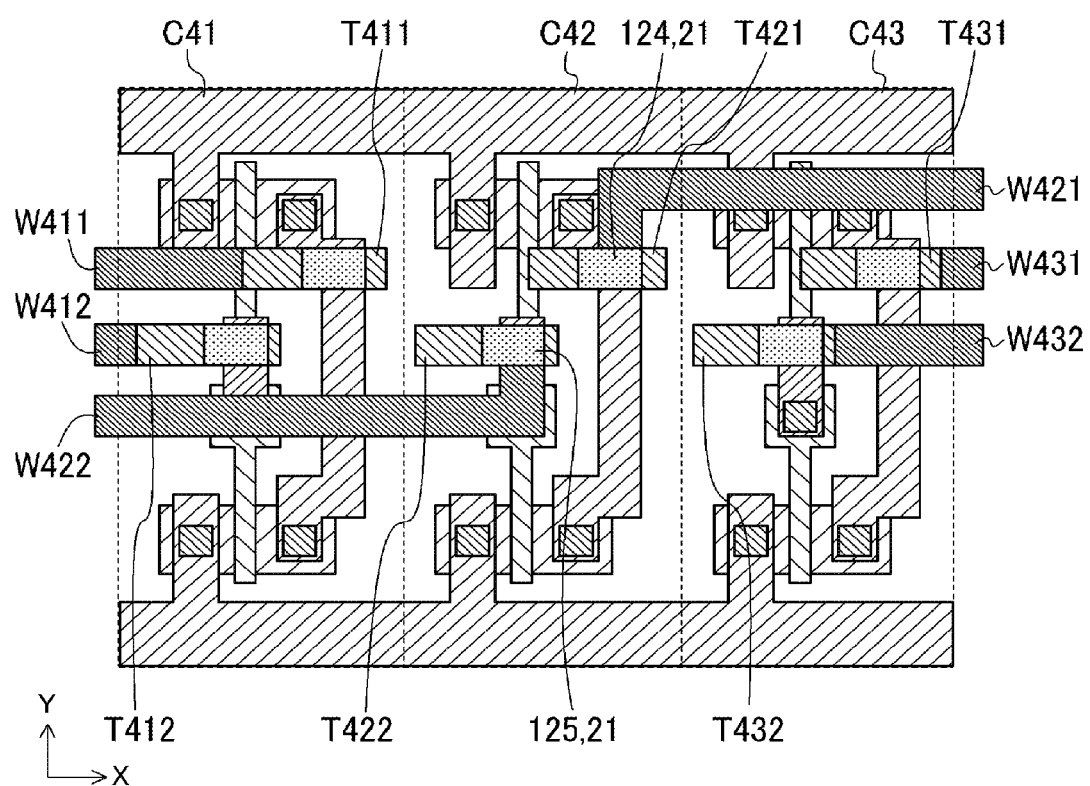
FIG. 24 is a view illustrating a configuration of a semiconductor integrated circuit device according to the eighth embodiment using the basic cell in FIG. 22.

FIG. 24 is a layout view of the semiconductor integrated circuit device according to the embodiment in which arrangement wiring is performed by using the basic cell 140 in FIG. 22. In FIG. 24, C41, C42, C43 denote basic cells, T411, T421, T431 denote first output signal lines which are terminals configured to transmit the output signals Vout of the basic cells C41, C42, C43, respectively, T412, T422, T432 denote first input signal lines which are terminals configured to transmit the input signals Vin of the basic cells C41, C42, C43, respectively. Further, W411, W421, W431 denote signal wirings which are formed on the same layer on which the first output signal lines T411, T421, T431 are formed, and are connected to the first output signal lines T411, T421, T431, respectively. W412, W422, W432 denote signal wirings which are formed on the same layer on which the first input signal lines T412, T422, T432 are formed, and are connected to the first input signal lines T412, T422, T432.

In FIG. 24, the signal wiring W421 is connected to the first output signal line T421 from the upper side in the Y direction and the signal wiring W422 is connected to the first input signal line T422 from the lower side in the Y direction as in FIG. 15(a). When the wirings are connection-wired in such a manner, bending portions 21 are formed on a connection between the first output signal line T421 and the signal wiring W421 and a connection between the first input signal line T422 and the signal wiring W422. The first and second vias 124, 125 are formed under the bending portions 21.

According to the embodiment, when the arrangement wiring is performed by using the basic cell, the first and second vias 124, 125 which have a deformed shape having a notch and of which areas are larger than the bending portion 21 are arranged and formed under the bending portion 21 at the connection of the wirings as described above. Therefore, an effect of improving the metal filling rate by the large via can be obtained so that the decrease in metal filling rate of via which is caused by the deformed via shape can be suppressed.

A shape of the via pattern used in the embodiment may be elliptical shape, alternatively, may be oval shape or rectangular shape as described in the fourth embodiment.

Note that the effect in the above embodiments can be obtained more in a device in which the width of wiring in a planar view is smaller than the depth thereof as the wiring is increasingly miniaturized.

In each of the above fifth to eighth embodiments, the basic cell having one kind of via shape is used. However, in the practical semiconductor integrated circuit device, the basic cells described in each embodiment may be arbitrary combined for use. The same operation effects as in each embodiment can be obtained with such configuration. That is to say, a plurality kinds of vias among vias described in the first to fourth embodiments may be mixed in the semiconductor integrated circuit device. For example, the via according to the first embodiment and the via according to the third embodiment may be mixed, the via according to the first embodiment and the via according to the fourth embodiment may be mixed, or the via according to the third embodiment and the via according to the fourth embodiment may be mixed, in the semiconductor integrated circuit device.

Further, the shape of the wiring having the bending portion is not limited to those shown in the drawings in each of the above fifth to eighth embodiments, and T-shape, L-shape, cross-shape or other-shapes may be employed.

In addition, although the CMOS inverter cell which is a standard cell is used as an example of the basic cell for description in each of the above fifth to eighth embodiments, the basic cell is not limited to the CMOS inverter. For example, the basic cell includes combination circuits such as an AND circuit and an OR circuit, sequential circuits such as a flip-flop, analog function block, and the like. The same operation effect as in each of the above embodiments can be obtained with these basic cells.

Further, although only the wiring and the via in the basic cell is described in each of the above fifth to eighth embodiments, the invention can be applied to wiring and via which are located outside the basic cell.

It is to be noted that even when the rectangular via pattern like the via pattern 9 in FIG. 1(g) or the via pattern 70 in FIG. 11(d) is used in each of the above embodiments, when the actual product is manufactured, via cannot be necessarily formed in accordance with the via pattern since corners of the via are rounded.

INDUSTRIAL APPLICABILITY

In the present invention, deterioration in manufacturing yield caused by insufficient filling into via can be suppressed in the semiconductor device and the semiconductor integrated circuit device using the basic cell. Therefore, the invention is effective to reduce the cost in LSI, for example.

DESCRIPTION OF REFERENCE CHARACTERS 1, 11, 12, 13, 14, 15 Wiring
1a First Wiring Region
1b Second Wiring Region
2, 21, 22 Bending Portion
3, 8 Via
7 First Projection
7a First Projection
7b Second Projection
7c First Projection
7d Second Projection
7e Third Projection
7f Fourth Projection
13a First Wiring Region
13b Second Wiring Region
14a First Wiring Region
14b Second Wiring Region
14c Third Wiring Region
15a First Wiring Region
15b Second Wiring Region
15c Third Wiring Region
15d Fourth Wiring Region
31, 32, 33 Via (Second Via)
41, 42, 43, 51, 52, 53, 54, 61, 62, 63, 64 Via
90, 91, 92 Projection
107 First Output Signal Line (First Wiring)
108 Second Output Signal Line (Second Wiring)
109 Via
112 First Input Signal Line (First Wiring)
113 Second Input Signal Line (Second Wiring)
114 Via
119 First Output Signal Line (First Wiring)
121 Via
122 First Input Signal Line (First Wiring)
123, 124, 125 Via
T121, T221, T321, T421 First Output Signal Line
T122, T222, T322, T422 First Input Signal Line
W121, W122, W221, W222, W321, W322, W421, W422 Signal Wiring

The invention claimed is:

1. A semiconductor device, comprising:
a first wiring;
a second wiring which is arranged under the first wiring; and
a first via which is formed between the first wiring and the second wiring and electrically connects the first wiring and the second wiring, wherein:
in a planar view, the first wiring comprises:
a bending portion;
a first wiring region extending from the bending portion in a first direction; and
a second wiring region extending from the bending portion in a second direction orthogonal to the first direction,
the bending portion, the first wiring region and the second wiring region are formed on a same layer,
in a planar view, the first via is formed in the first wiring region so as not to overlap with a region of the bending portion,
a length of the first via in the first direction is longer than a length of the first via in the second direction, and
both ends of the first via in the second direction are overlapped with both ends of the first wiring region in the second direction.

2. The semiconductor device of claim 1, wherein
the second wiring passes through a portion under the bending portion.

3. The semiconductor device of claim 1, wherein
both ends of the first via in the first direction have a circular arc shape expanding outward in a planar view.

4. A semiconductor device, comprising:
a first wiring;
a second wiring which is arranged under the first wiring; and
a first via which is formed between the first wiring and the second wiring and electrically connects the first wiring and the second wiring; and
a second via which is formed between the first wiring and the second wiring and electrically connects the first wiring and the second wiring, wherein:
in a planar view, the first wiring comprises:
a bending portion;
a first wiring region extending from the bending portion in a first direction; and
a second wiring region extending from the bending portion in a second direction orthogonal to the first direction,
in a planar view, the first via is formed in the first wiring region so as not to overlap with a region of the bending portion,
a length of the first via in the first direction is longer than a length of the first via in the second direction,
both ends of the first via in the second direction are overlapped with both ends of the first wiring region in the second direction, and
the second via is arranged so as to include the bending portion, a part of the first wiring region and a part of the second wiring region in a planar view.

5. The semiconductor device of claim 1, wherein
a width of the first wiring in a planar view is smaller than a depth of the first wiring.

6. The semiconductor device of claim 4, wherein:
in a planar view, the bending portion has at least one side other than two sides from which the first wiring region and the second wiring region extend, respectively, and
in a planar view, the at least one side is flush with a corresponding one side of the second via.

7. The semiconductor device of claim 4, wherein:
in a planar view, the bending portion has a corner portion which is made by two sides of the bending portion other than two sides from which the first wiring region and the second wiring region extend, respectively, and
in a planar view, the corner portion is flush with a corresponding one corner of the second via.

8. The semiconductor device of claim 1, wherein:
in a planar view, the first wiring fully covers the first via.

9. The semiconductor device of claim 4, wherein:
in a planar view, the first wiring fully covers the first via and the second via.

10. The semiconductor device of claim 1, wherein
in a planar view, the first wiring further comprises a third wiring region extending from the bending portion in the first direction and in an opposite side with respect to the bending portion.

11. The semiconductor device of claim 1, wherein
in a planar view, the first wiring further comprises a fourth wiring region extending from the bending portion in the second direction and in an opposite side with respect to the bending portion.

12. The semiconductor device of claim 10, wherein
in a planar view, the first wiring further comprises a fourth wiring region extending from the bending portion in the second direction and in an opposite side with respect to the bending portion.

13. The semiconductor device of claim 4, wherein
the second wiring passes through a portion under the bending portion.

14. The semiconductor device of claim 4, wherein
both ends of the first via in the first direction have a circular arc shape expanding outward in a planar view.

15. The semiconductor device of claim 4, wherein
a width of the first wiring in a planar view is smaller than a depth of the first wiring.

16. The semiconductor device of claim 4, wherein:
in a planar view, the first wiring fully covers the first via.

17. The semiconductor device of claim 4, wherein
in a planar view, the first wiring further comprises a third wiring region extending from the bending portion in the first direction and in an opposite side with respect to the bending portion.

18. The semiconductor device of claim 4, wherein
in a planar view, the first wiring further comprises a fourth wiring region extending from the bending portion in the second direction and in an opposite side with respect to the bending portion.

19. The semiconductor device of claim 17, wherein
in a planar view, the first wiring further comprises a fourth wiring region extending from the bending portion in the second direction and in an opposite side with respect to the bending portion.

* * * * *